(12) United States Patent
Yi et al.

(10) Patent No.: US 12,501,791 B2
(45) Date of Patent: Dec. 16, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Hong Yi, Beijing (CN); Mengqi Wang, Beijing (CN); Wenbo Chen, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 650 days.

(21) Appl. No.: 17/905,670

(22) PCT Filed: Dec. 17, 2021

(86) PCT No.: PCT/CN2021/139253
§ 371 (c)(1),
(2) Date: Sep. 6, 2022

(87) PCT Pub. No.: WO2023/108629
PCT Pub. Date: Jun. 22, 2023

(65) Prior Publication Data
US 2024/0206250 A1 Jun. 20, 2024

(51) Int. Cl.
*H10K 59/131* (2023.01)
*H10K 102/00* (2023.01)

(52) U.S. Cl.
CPC ..... *H10K 59/131* (2023.02); *H10K 2102/311* (2023.02)

(58) Field of Classification Search
CPC .................................................. H10K 59/131
See application file for complete search history.

(56) References Cited

U.S. PATENT DOCUMENTS 10,031,363 B2 * 7/2018 Chen ..................... G06F 3/0412
2016/0357049 A1   12/2016 Chen et al.
(Continued)

FOREIGN PATENT DOCUMENTS

| CN | 105867035 A | 8/2016 |
| CN | 106444182 A | 2/2017 |

(Continued)

OTHER PUBLICATIONS

International Search Report & Written Opinion mailed Aug. 30, 2022, regarding PCT/CN2021/139253.

*Primary Examiner* — Douglas M Menz
(74) *Attorney, Agent, or Firm* — Intellectual Valley Law, P.C.

(57) ABSTRACT

An array substrate is provided, comprising a plurality of signal lines; wherein a respective signal line of the plurality of signal lines comprises a first portion in a first area and a second portion in a second area, the first portion and the second portion being in different layers; second portions of the plurality of signal lines are grouped into a plurality of pairs, a respective pair comprising a first-second portion and a second-second portion of two adjacent signal lines of the plurality of signal lines; and an orthographic projection of the first-second portion on a base substrate and an orthographic projection of the second-second portion on the base substrate at least partially overlap with each other.

19 Claims, 22 Drawing Sheets

(56) References Cited

U.S. PATENT DOCUMENTS

| | | |
|---|---|---|
| 2017/0287936 A1 | 10/2017 | Kim et al. |
| 2017/0329190 A1* | 11/2017 | Chen .................. H10D 86/0212 |
| 2018/0197932 A1 | 7/2018 | Ho |
| 2018/0301520 A1 | 10/2018 | Jin et al. |
| 2019/0088685 A1 | 3/2019 | Huang et al. |
| 2021/0257389 A1 | 8/2021 | Zhang et al. |

FOREIGN PATENT DOCUMENTS

| | | |
|---|---|---|
| CN | 107121860 A | 9/2017 |
| CN | 107634086 A | 1/2018 |
| CN | 108305888 A | 7/2018 |
| CN | 108376685 A | 8/2018 |
| CN | 108695343 A | 10/2018 |
| CN | 108732833 A | 11/2018 |
| CN | 112002699 A | 11/2020 |
| JP | 2012243382 A | 12/2012 |

* cited by examiner

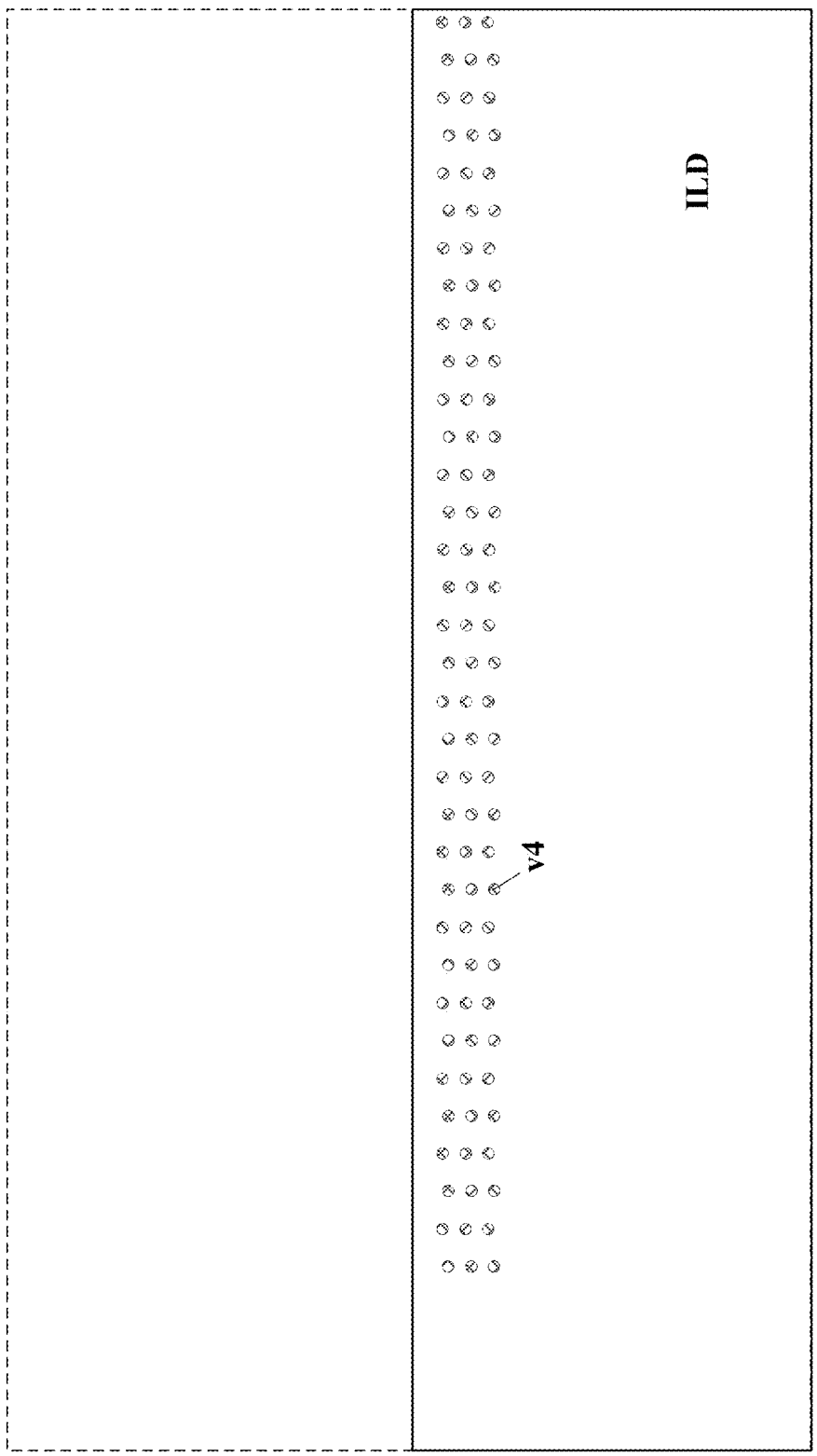

ARRAY SUBSTRATE AND DISPLAY APPARATUS

CROSS-REFERENCE TO RELATED APPLICATION

This application is a national stage application under 35 U.S.C. § 371 of International Application No. PCT/CN2021/139253, filed Dec. 17, 2021, the contents of which are incorporated by reference in the entirety.

TECHNICAL FIELD

The present invention relates to display technology, more particularly, to an array substrate and a display apparatus.

BACKGROUND

A flexible display apparatus is a bendable or deformable display apparatus having a flexible display panel. Examples of flexible display apparatuses include a flexible organic light emitting diode (OLED) display apparatus, a flexible electrophoretic display (EPD) apparatus, and a flexible liquid crystal display (LCD) apparatus. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In a first aspect, the present disclosure provides an array substrate, comprising a plurality of signal lines; wherein a respective signal line of the plurality of signal lines comprises a first portion in a first area and a second portion in a second area, the first portion and the second portion being in different layers; second portions of the plurality of signal lines are grouped into a plurality of pairs, a respective pair comprising a first-second portion and a second-second portion of two adjacent signal lines of the plurality of signal lines; and an orthographic projection of the first-second portion on a base substrate and an orthographic projection of the second-second portion on the base substrate at least partially overlap with each other.

In some embodiments of the present disclosure, at least two first portions of the plurality of signal lines are in two different layers.

In some embodiments of the present disclosure, first portions of the plurality of signal lines are alternately in a first metal layer and a second metal layer.

In some embodiments of the present disclosure, the respective signal line of the plurality of signal lines further comprises a third portion between the first portion and the second portion, and in a third area; and the third portion comprises a first sub-layer connected to, in a same layer as, the first portion, and a second sub-layer connected to, in a same layer as, the second portion.

In some embodiments of the present disclosure, the second sub-layer is connected to the first sub-layer through a via extending through an insulating layer.

In some embodiments of the present disclosure, orthographic projections of adjacent third portions on the base substrate are at least partially non-overlapping.

In some embodiments of the present disclosure, second sub-layers of third portions of the plurality of signal lines are alternately in a first signal line layer and a second signal line layer.

In some embodiments of the present disclosure, at least two first sub-layers of third portions of the plurality of signal lines are in two different layers.

In some embodiments of the present disclosure, first sub-layers of third portions of the plurality of signal lines are alternately in a first metal layer and a second metal layer.

In some embodiments of the present disclosure, the array substrate comprises a plurality of junction structures; wherein a respective junction structure comprises: the first-second portion; the second-second portion; a first-first sub-layer of a first-third portion; a first-second sub-layer of the first-third portion connected to, in a same layer as, the first-second portion; a second-first sub-layer of a second-third portion; and a second-second sub-layer of the second-third portion connected to, in a same layer as, the second-second portion.

In some embodiments of the present disclosure, the first-first sub-layer, the first-second sub-layer, the second-first sub-layer, and the second-second sub-layer are in four different layers, respectively.

In some embodiments of the present disclosure, the first-first sub-layer and the second-first sub-layer are in two different layers selected from a first metal layer and a second metal layer; and the first-second sub-layer and the second-second sub-layer are in two different layers selected from a first signal line layer and a second signal line layer.

In some embodiments of the present disclosure, the first-first sub-layer is connected to, in a same layer as, a first-first portion; the second-first sub-layer is connected to, in a same layer as, a second-first portion; and the first-first portion and the second-first portion are two adjacent first portions of the two adjacent signal lines.

In some embodiments of the present disclosure, the respective signal line of the plurality of signal lines further comprises a fourth portion in a fourth area; the fourth portion is on a side of the first portion away from the second portion; the fourth portion is connected to, in a same layer as, the first portion; and extension directions of the fourth portion and the first portion are different.

In some embodiments of the present disclosure, at least two fourth portions of the plurality of signal lines are in two different layers.

In some embodiments of the present disclosure, fourth portions of the plurality of signal lines are alternately in a first metal layer and a second metal layer.

In some embodiments of the present disclosure, orthographic projections of two adjacent fourth portions are partially overlapping with each other.

In some embodiments of the present disclosure, extension direction of the first portion and the second portion are substantially the same.

In some embodiments of the present disclosure, the first area is a fanout area of the array substrate and the second area is a bending area of the array substrate.

In a second aspect, the present disclosure provides a display apparatus, comprising the array substrate of any one of the above embodiments of the present disclosure, and an integrated circuit connected to the array substrate.

BRIEF DESCRIPTION OF THE FIGURES

The following drawings are merely examples for illustrative purposes according to various disclosed embodiments and are not intended to limit the scope of the present invention.

FIG. 5D illustrates the structure of an inter-layer dielectric layer in a region of an array substrate depicted in FIG. 5A.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of signal lines. Optionally, a respective signal line of the plurality of signal lines comprises a first portion in a first area and a second portion in a second area, the first portion and the second portion being in different layers. Optionally, second portions of the plurality of signal lines are grouped into a plurality of pairs, a respective pair comprising a first-second portion and a second-second portion of two adjacent signal lines of the plurality of signal lines. Optionally, orthographic projections of the first-second portion and the second-second portion on a base substrate at least partially overlap with each other.

Figure 1:
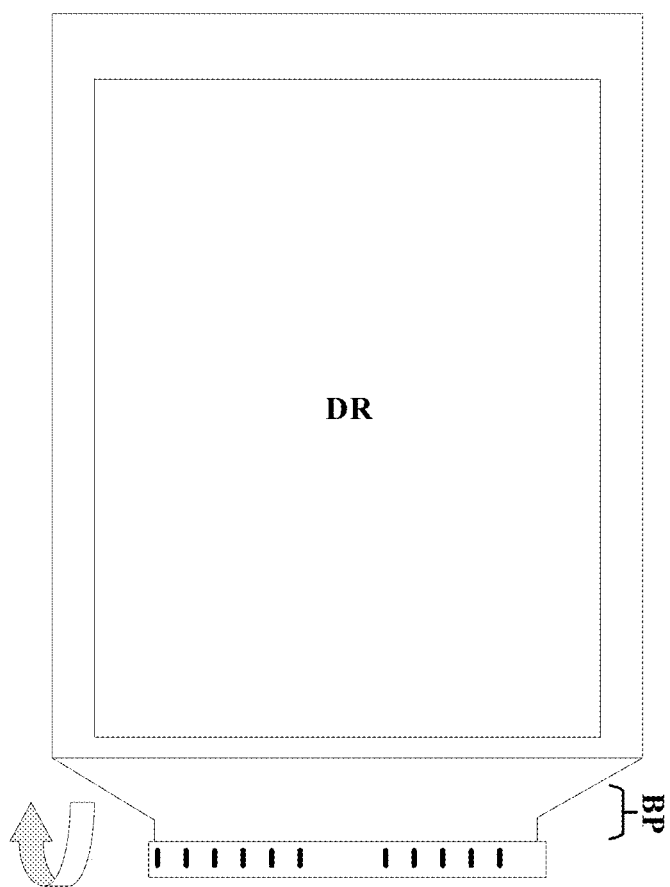
FIG. 1 is a schematic diagram of an array substrate in some embodiments according to the present disclosure.

FIG. 1 is a schematic diagram of an array substrate in some embodiments according to the present disclosure. Referring to FIG. 1, the array substrate in some embodiments includes a display portion in a display area DR where an image is displayed by an array of subpixels in the display portion. A peripheral area of the display apparatus surrounds the display area DR. Although a rectangular display area is shown in FIG. 1, the display area DR may have any appropriate shapes and dimensions. Examples of appropriate shapes of the display area DR include a circular shape, a square shape, a hexagonal shape, an elliptical shape, and an irregular polygon shape. Each subpixel in the display area DR may be electrically connected to a pixel driving circuit, which includes one or more thin film transistors. The array substrate further includes gate lines and data lines for providing signals for driving image display in the display area DR. These signal lines are electrically connected to one or more integrated circuits such as gate driving integrated circuit and data driving integrated circuit. The one or more integrated circuits may be integrated into the display panel (chip-on-glass) or mounted on a flexible printed circuit (chip-on-film). The one or more integrated circuits are electrically connected to the flexible printed circuit. The display apparatus further includes various other signal lines such as a high voltage supply line VDD, a low voltage supply line VSS, and an initiation signal line.

Figure 2:
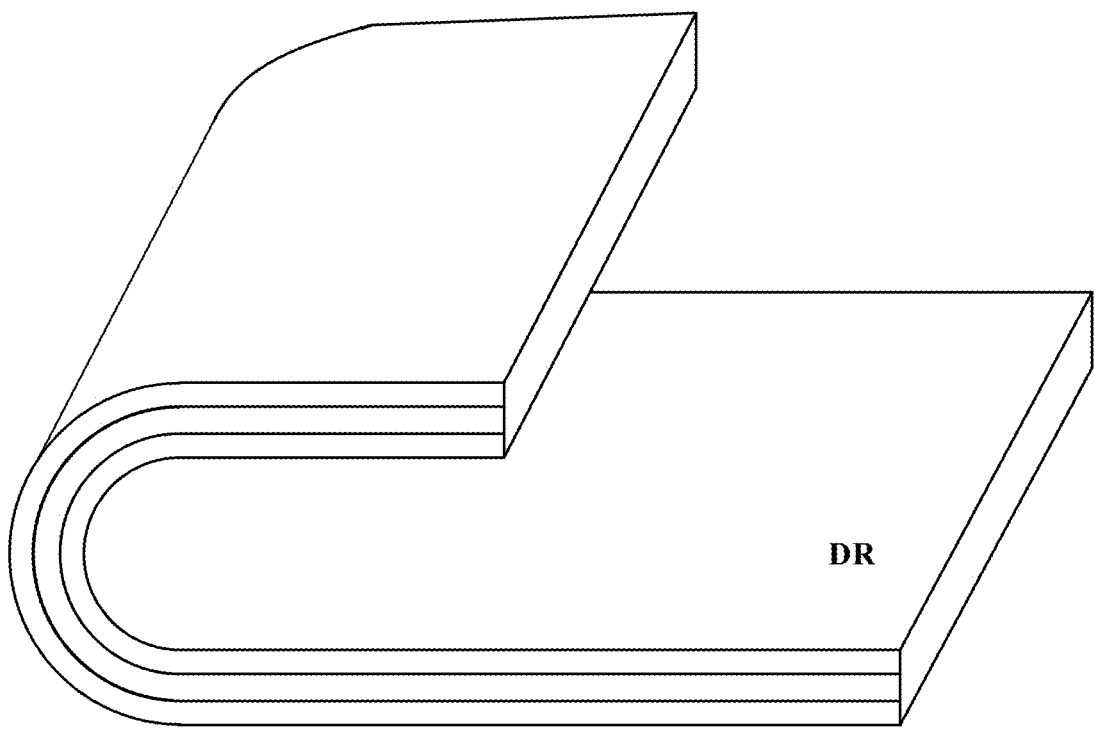
FIG. 2 is a schematic diagram of an array substrate in some embodiments according to the present disclosure.

The display apparatus further includes a bending portion BP in a bending area BDA. The bending portion PBP is flexible or bendable. As shown in FIG. 1, the bending portion BP may be bent along the direction of an arrow depicted in FIG. 1 so that a portion of the array substrate can be bent toward a back side of the display portion. FIG. 2 is a schematic diagram of an array substrate in some embodiments according to the present disclosure. FIG. 2 depicts an array substrate in which the bending portion BP is bent, and a portion of the array substrate is bent toward the back side of the display portion.

Figure 3:
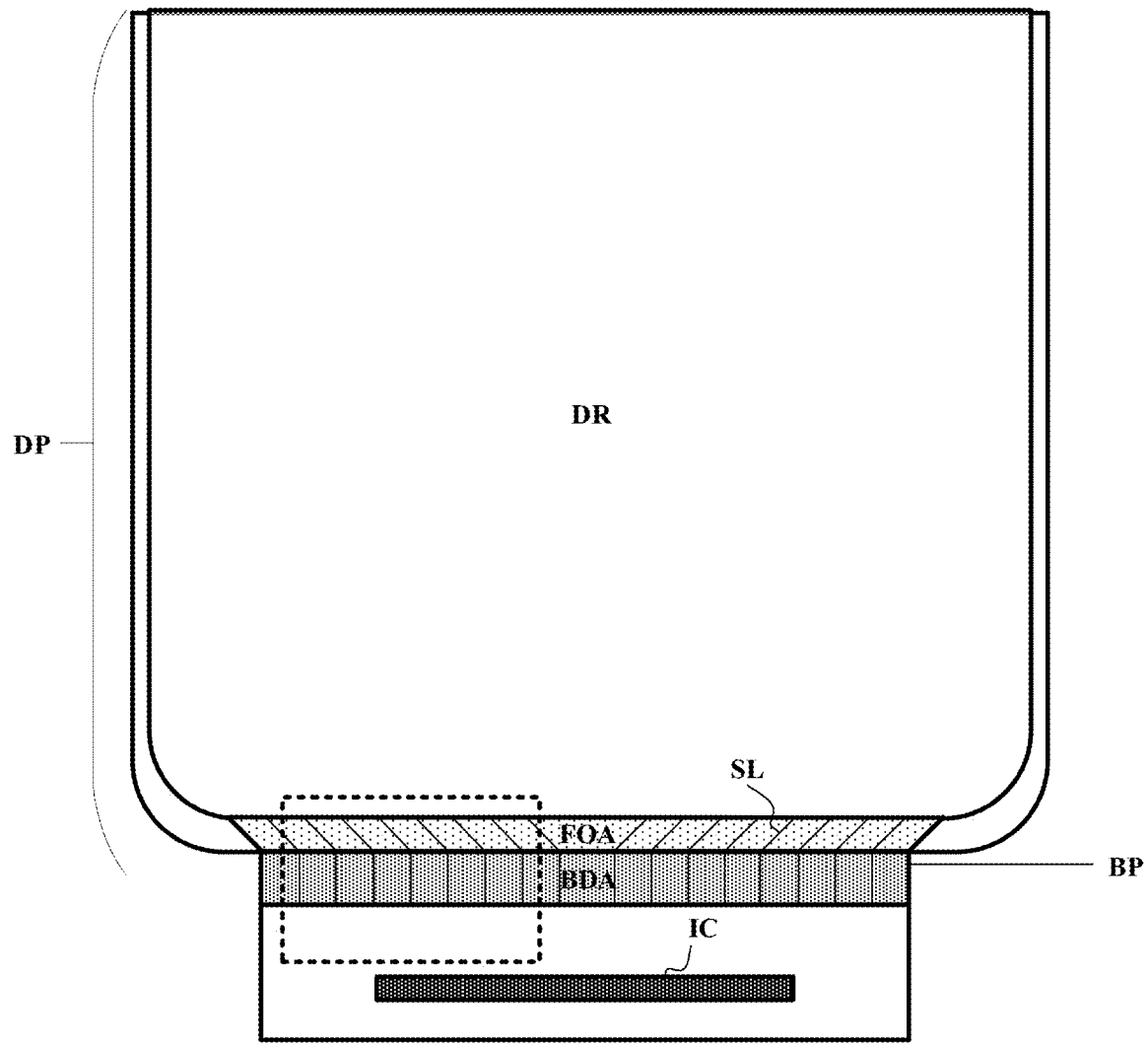
FIG. 3 is a plan view of an array substrate in some embodiments according to the present disclosure.

FIG. 3 is a plan view of an array substrate in some embodiments according to the present disclosure. Referring to FIG. 3, the display portion DP in some embodiments is in a display area DR in which an image is displayed, a bending portion BP is in a bending area BDA, and a fanout area FOA is between the display area DR and the bending portion PBP, the display portion DP including a plurality of signal lines SL extending through the fanout area FOA.

As used herein, the term "display area" refers to a region of an array substrate in a display apparatus where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the display apparatus is a flexible display apparatus.

As used herein the term "peripheral area" refers to an area of an array substrate in a display apparatus where various circuits and wires are provided to transmit signals to the array substrate. To increase the transparency of the display apparatus, non-transparent or opaque components of the display apparatus (e.g., battery, printed circuit board, metal frame), can be disposed in the peripheral area rather than in the display areas.

Figure 4A:
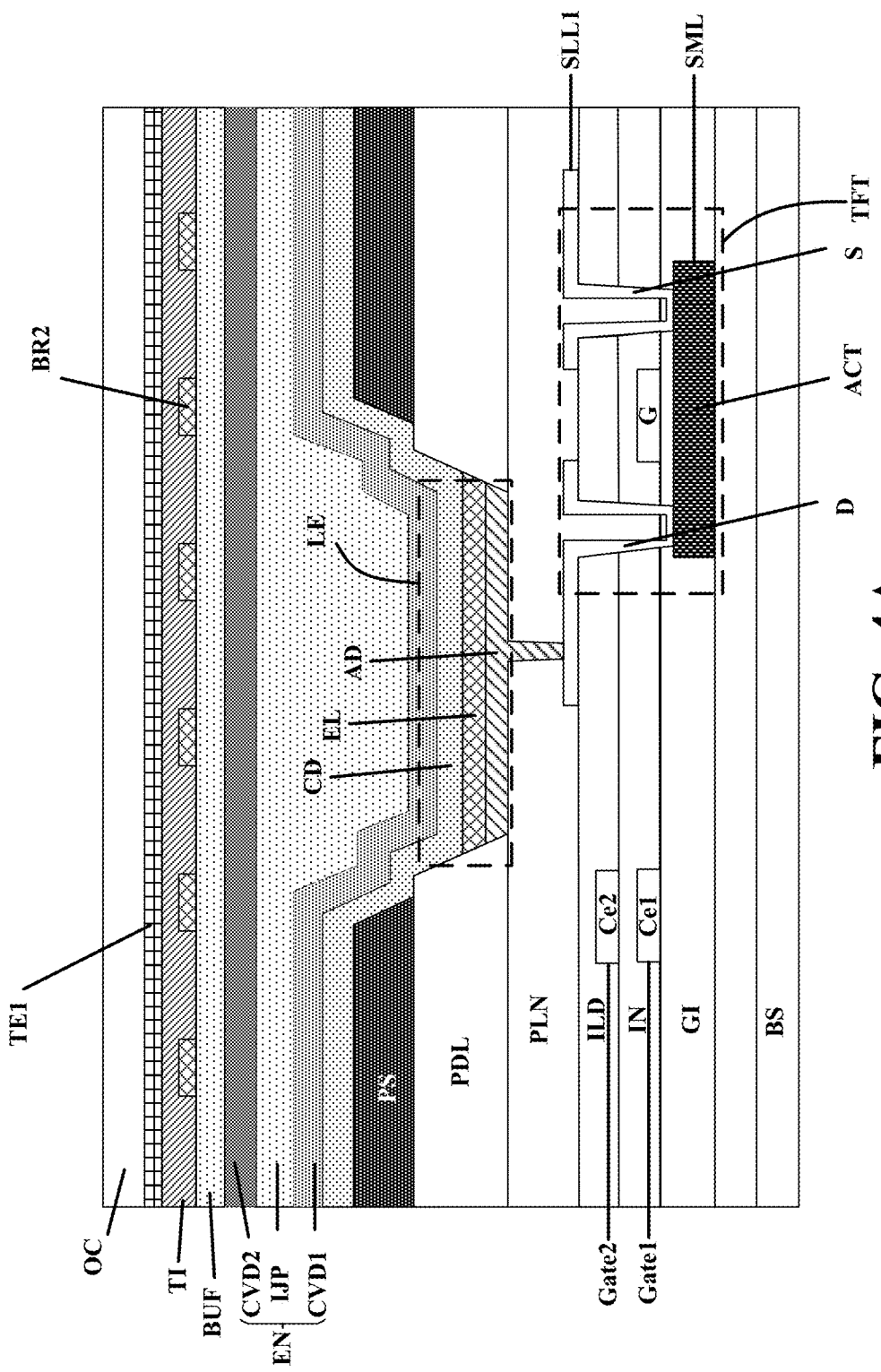
FIG. 4A illustrates a detailed structure in a display area in an array substrate in some embodiments according to the present disclosure

FIG. 4A illustrates a detailed structure in a display area in an array substrate in some embodiments according to the present disclosure. Referring to FIG. 4A, the array substrate in the display area in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a planarization layer PLN on a side of the source electrode S and the drain electrode D away from the inter-layer dielectric layer ILD; a pixel definition layer PDL defining a subpixel aperture and on a side of the planarization layer PLN away from the base substrate BS; and a light emitting element LE in the subpixel aperture. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The array substrate in the display area further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The array substrate in the display area further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI.

Figure 4B:
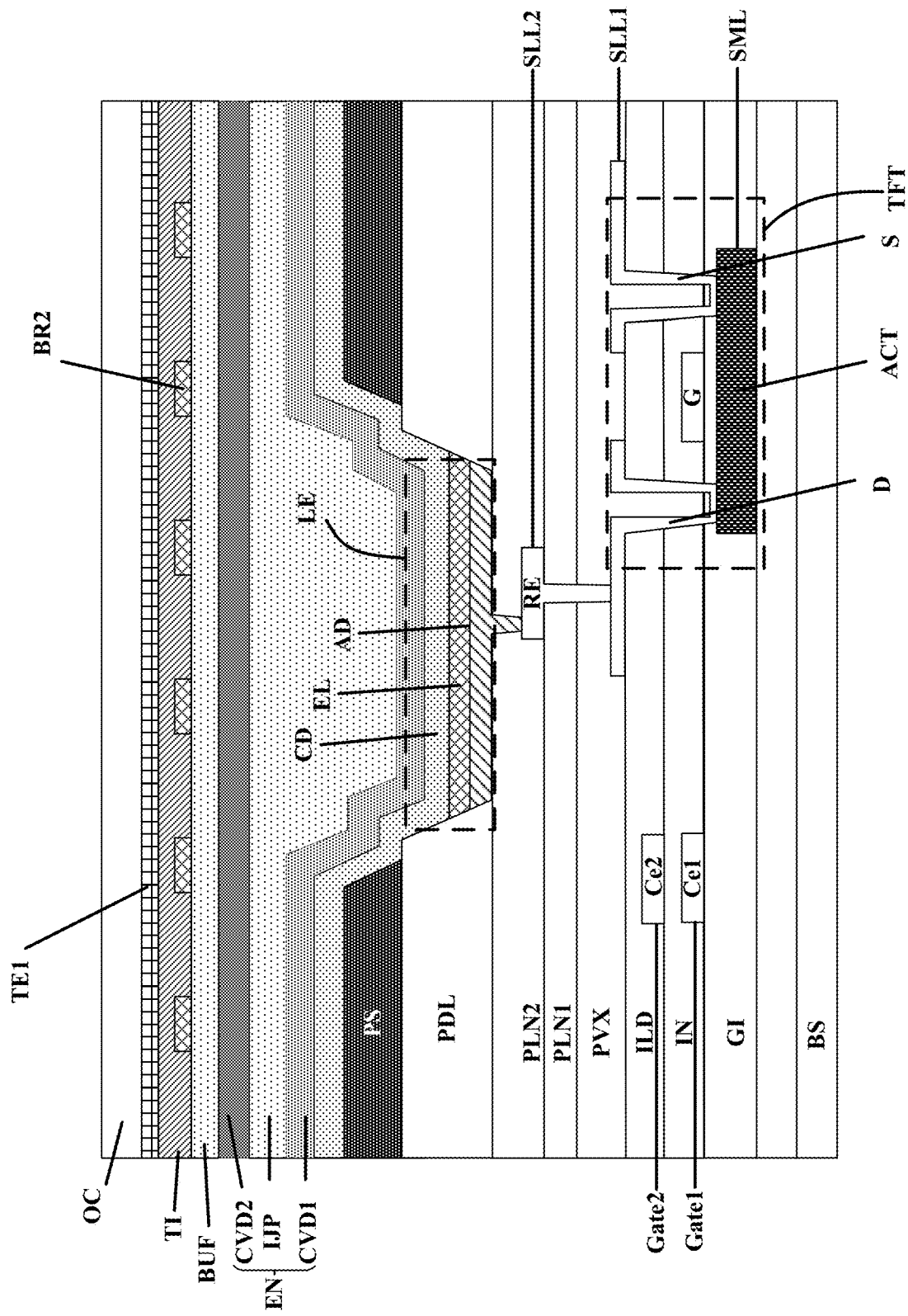
FIG. 4B illustrates a detailed structure in a display area in an array substrate in some embodiments according to the present disclosure.

FIG. 4B illustrates a detailed structure in a display area in an array substrate in some embodiments according to the present disclosure. Referring to FIG. 4B, the array substrate in the display area in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a second planarization layer PLN2 on side of the first planarization layer PLN1 away from the passivation layer PVX; a relay electrode RE (part of a second SD metal layer) on a side of the second planarization layer PLN2 away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The array substrate in the display area further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The array substrate in the display area further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI. Optionally, the array substrate in the display area does not include the passivation layer PVX, e.g., the inter-layer dielectric layer ILD is in direct contact with the first planarization layer PLN1.

Referring to FIG. 4A and FIG. 4B, the array substrate includes a semiconductor material layer SML, a first gate metal layer Gate1, a second gate metal layer Gate2, a first signal line layer SLL1, and a second signal line layer SLL2. The array substrate further includes an insulating layer IN between the first gate metal layer Gate1 and the second gate metal layer Gate2; an inter-layer dielectric layer ILD between the second conductive layer Gate2 and the first signal line layer SLL1; and at least a passivation layer PVX or a planarization layer PLN between the first signal line layer SLL1 and the second signal line layer SLL2.

Figure 5A:
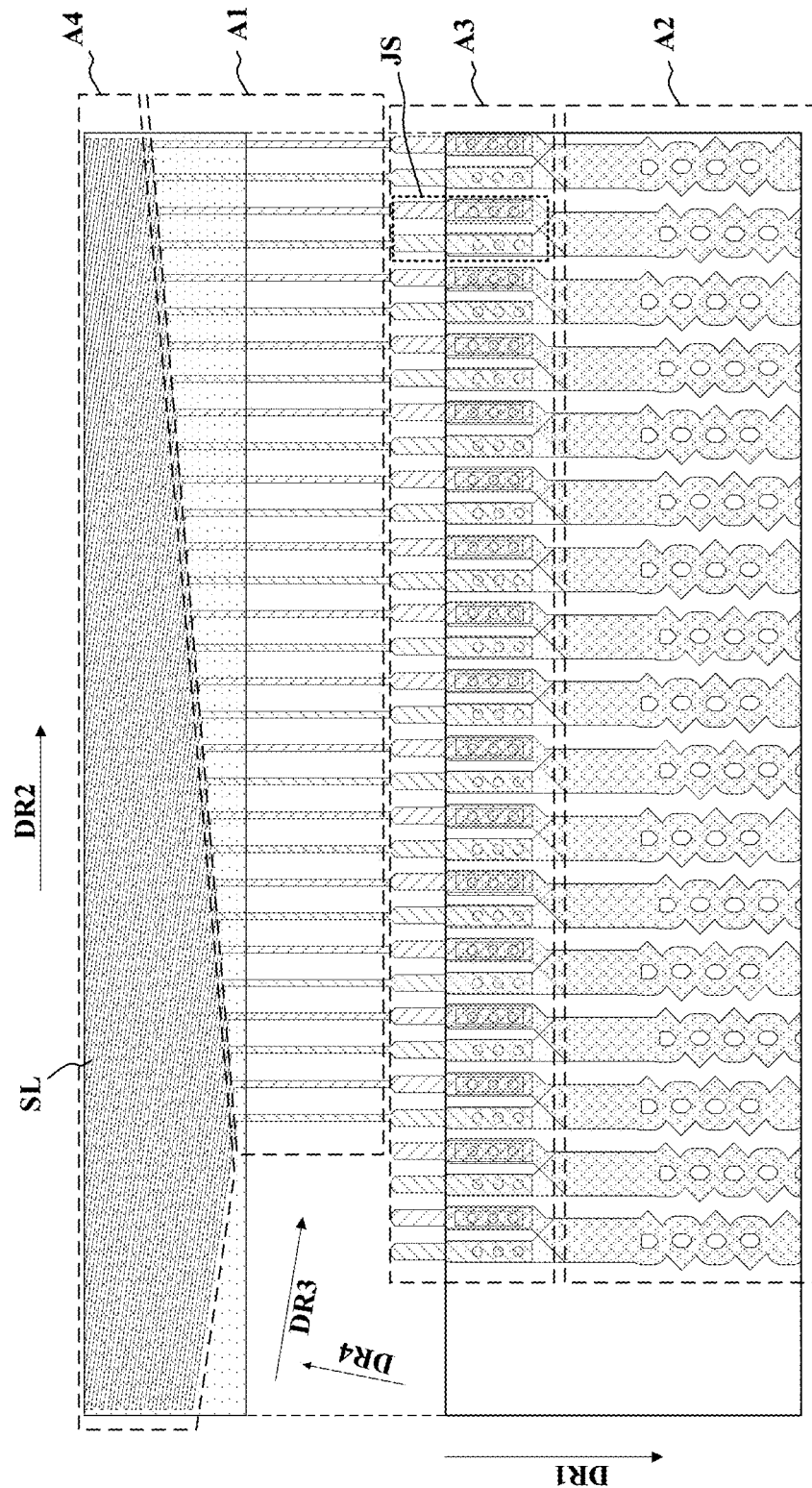
FIG. 5A is a zoom-in view of a region circled by dotted line in FIG. 3 in some embodiments according to the present disclosure.
Figure 5B:
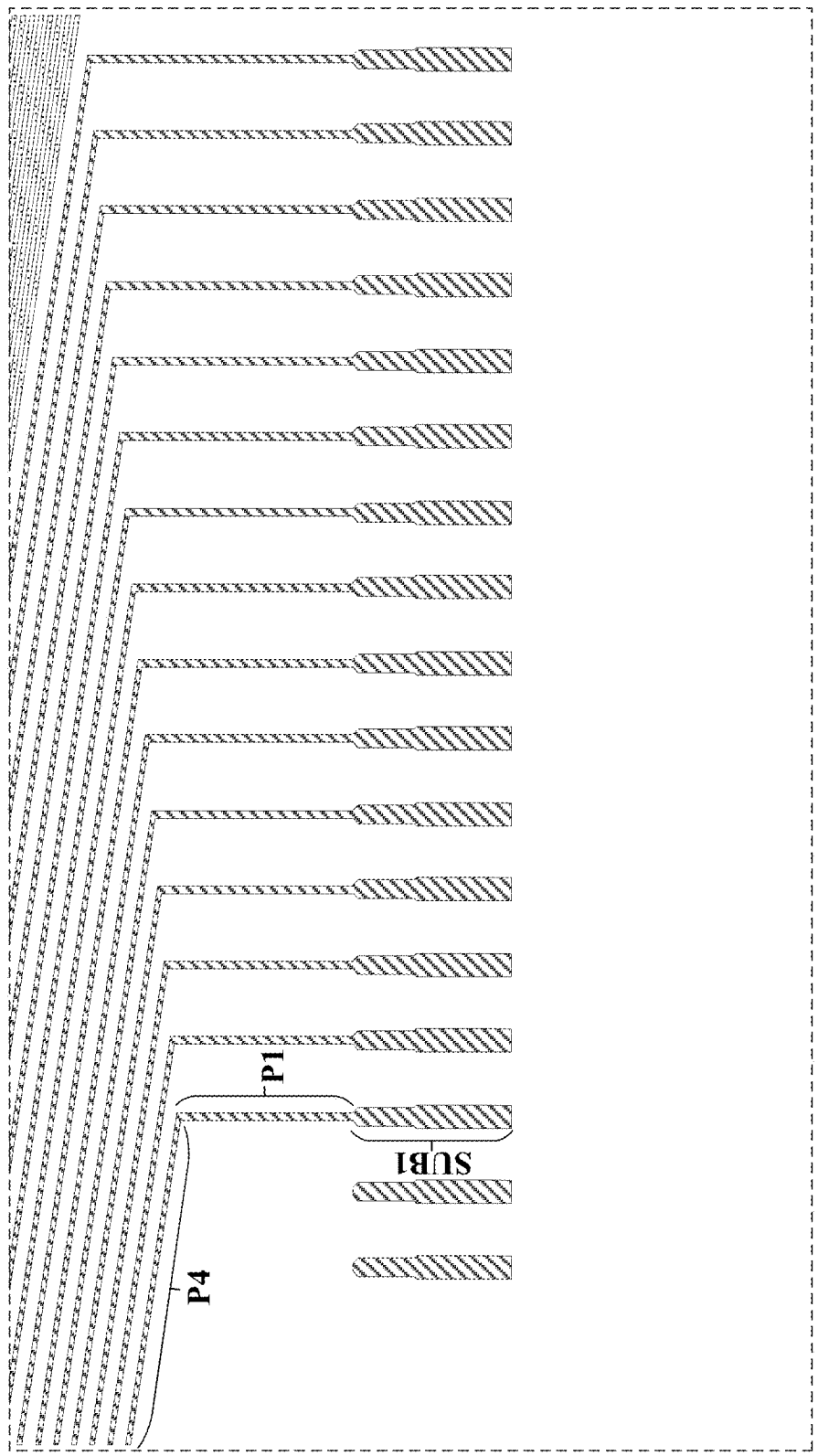
FIG. 5B illustrates the structure of a first metal layer in a region of an array substrate depicted in FIG. 5A.
Figure 5C:
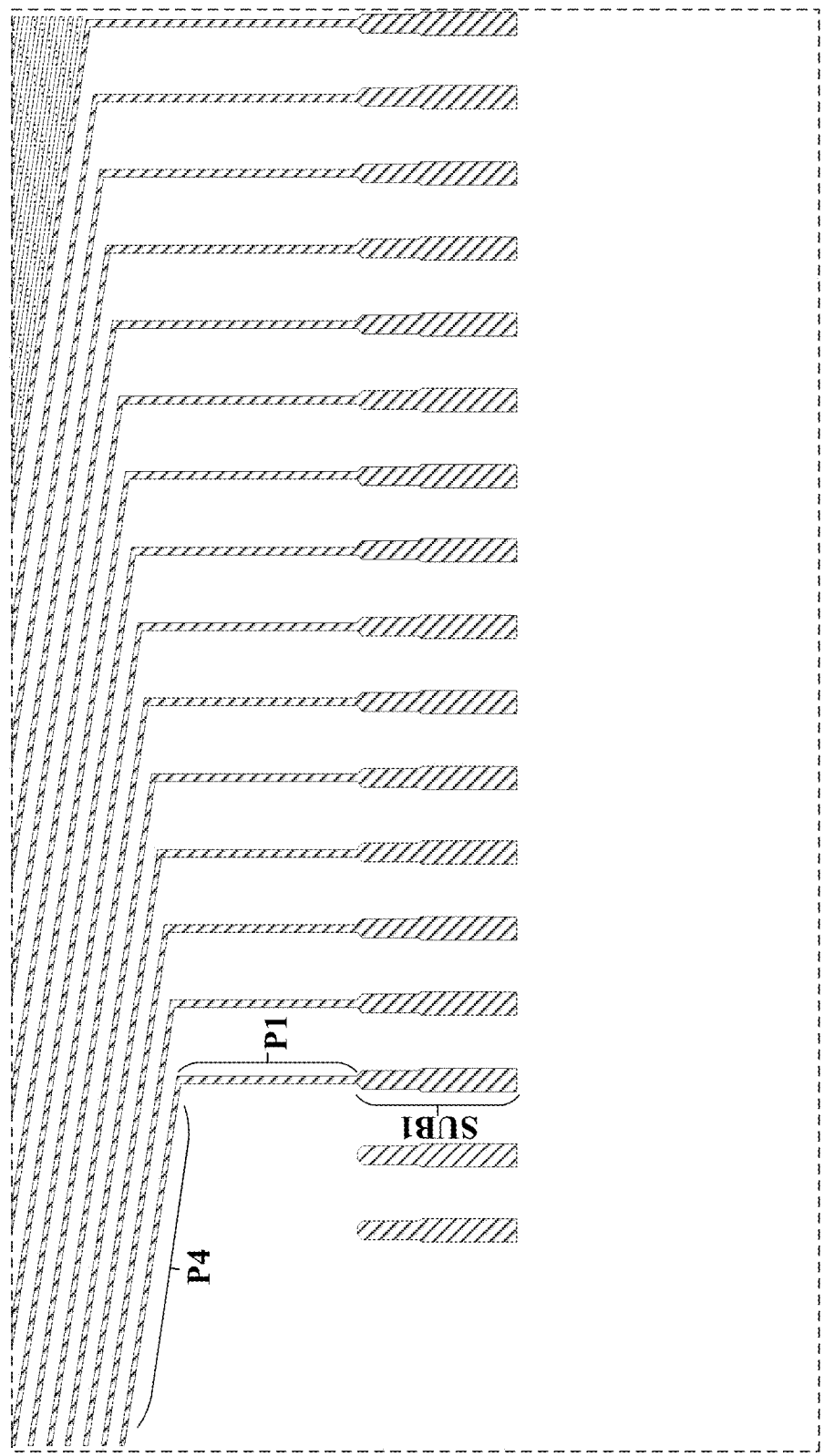
FIG. 5C illustrates the structure of a second metal layer in a region of an array substrate depicted in FIG. 5A.
Figure 5E:
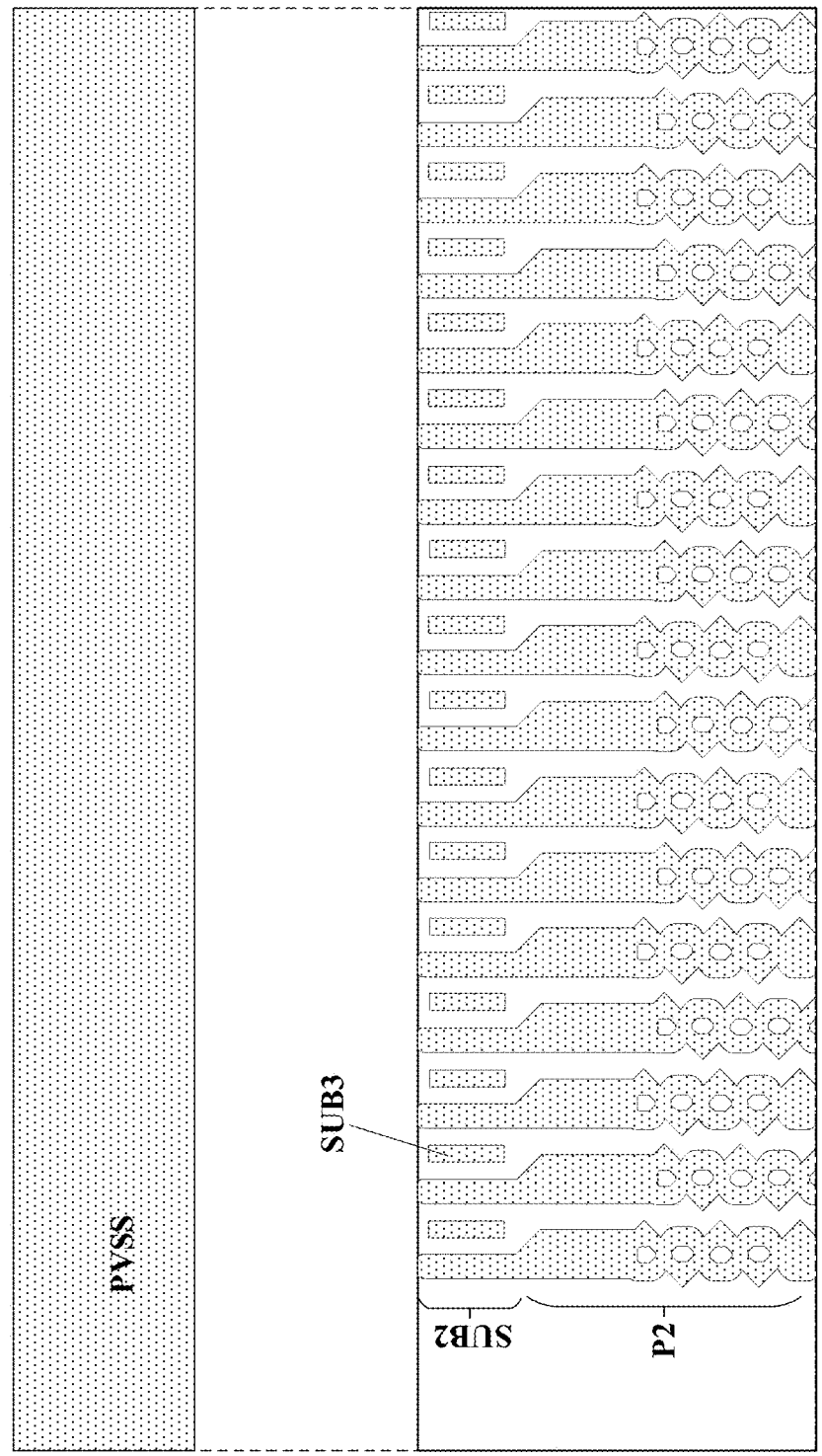
FIG. 5E illustrates the structure of a first signal line layer in a region of an array substrate depicted in FIG. 5A.
Figure 5F:
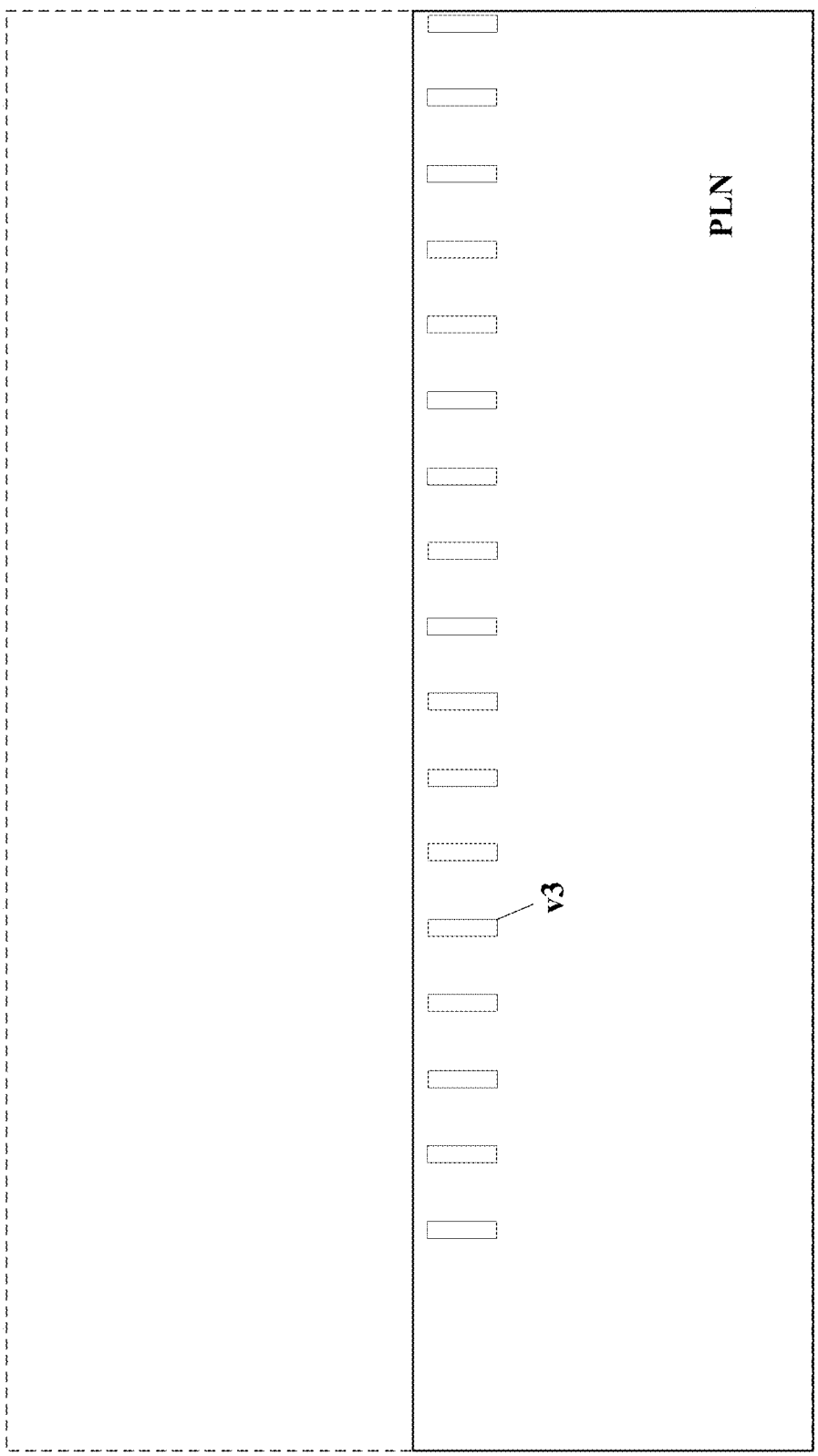
FIG. 5F illustrates the structure of a planarization layer in a region of an array substrate depicted in FIG. 5A.
Figure 5G:
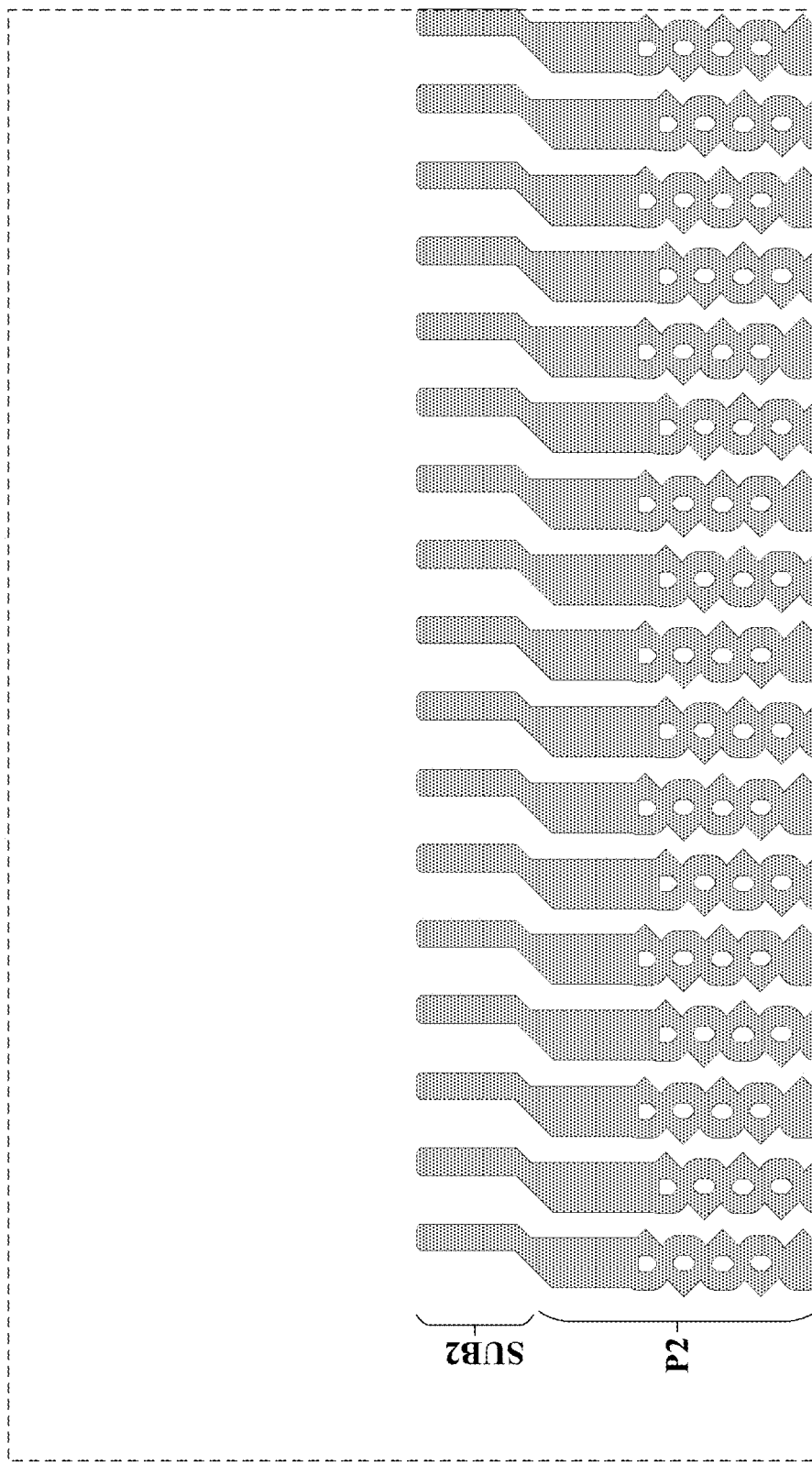
FIG. 5G illustrates the structure of a second signal line layer in a region of an array substrate depicted in FIG. 5A.

FIG. 5A is a zoom-in view of a region circled by dotted line in FIG. 3 in some embodiments according to the present disclosure. FIG. 5B illustrates the structure of a first metal layer in a region of an array substrate depicted in FIG. 5A. FIG. 5C illustrates the structure of a second metal layer in a region of an array substrate depicted in FIG. 5A. FIG. 5D illustrates the structure of an inter-layer dielectric layer in a region of an array substrate depicted in FIG. 5A. FIG. 5E illustrates the structure of a first signal line layer in a region of an array substrate depicted in FIG. 5A. FIG. 5F illustrates the structure of a planarization layer in a region of an array substrate depicted in FIG. 5A. FIG. 5G illustrates the structure of a second signal line layer in a region of an array substrate depicted in FIG. 5A. Referring to FIG. 5A to FIG. 5G, the array substrate includes a plurality of signal lines SL in a peripheral area.

Figure 6:
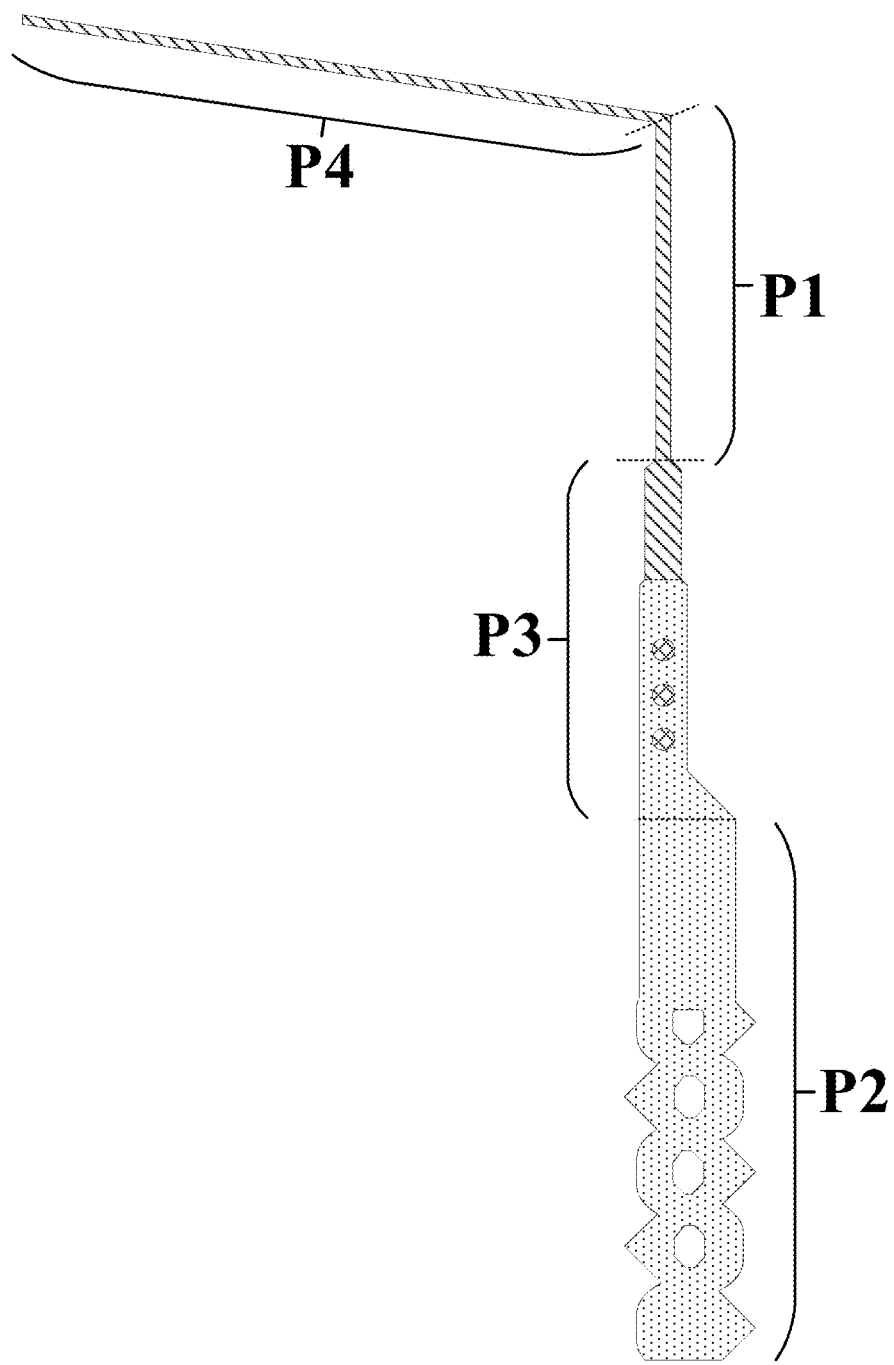
FIG. 6 illustrates the structure of a respective signal line in some embodiments according to the present disclosure.

FIG. 6 illustrates the structure of a respective signal line in some embodiments according to the present disclosure. Referring to FIG. 5A and FIG. 6, the respective signal line of the plurality of the signal lines SL in some embodiments a first portion P1 in a first area A1 and a second portion P2 in a second area A2.

The first area A1 and the second area A2 are both part of the peripheral area. The first area A1 and the second area A2 may be spaced apart from each other, as depicted in FIG. 5A. In one example, the first area A1 is at least a portion of the fanout area FOA depicted in FIG. 3. In another example, the second area A2 is at least a portion of the bending area BDA depicted in FIG. 3.

In some embodiments, the first portion P1 and the second portion P2 are in different layers. Referring to FIG. 5A to FIG. 5G, and FIG. 6, first portions of the plurality of signal lines SL are either in the first metal layer or in the second metal layer; second portions of the plurality of signal lines SL are either in the first signal line layer or in the second signal line layer. The first metal layer, the second metal layer; the first signal line layer, and the second signal line layer are four different layers.

Optionally, the first metal layer is in a same layer as the first gate metal layer Gate1 as depicted in FIG. 4A or FIG. 4B, and the second metal layer is in a same layer as the second gate metal layer Gate2 as depicted in FIG. 4A or FIG. 4B.

Optionally, the first metal layer is in a same layer as the second gate metal layer Gate2 as depicted in FIG. 4A or FIG. 4B, and the second metal layer is in a same layer as the first gate metal layer Gate1 as depicted in FIG. 4A or FIG. 4B.

Optionally, the first signal line layer is the first signal line layer SLL1 as depicted in FIG. 4A or FIG. 4B, and the second signal line layer is the second signal line layer SLL2 as depicted in FIG. 4B.

Optionally, at least one of the first signal line layer and the second signal line layer may be in a same layer as the anode AD as depicted in FIG. 4A or FIG. 4B.

Optionally, the first signal line layer and the second signal line layer are two different layer selected from the first signal line layer SLL1, the second signal line layer SLL2, an anode layer, and a touch electrode layer as depicted in FIG. 4B.

Figure 7A:
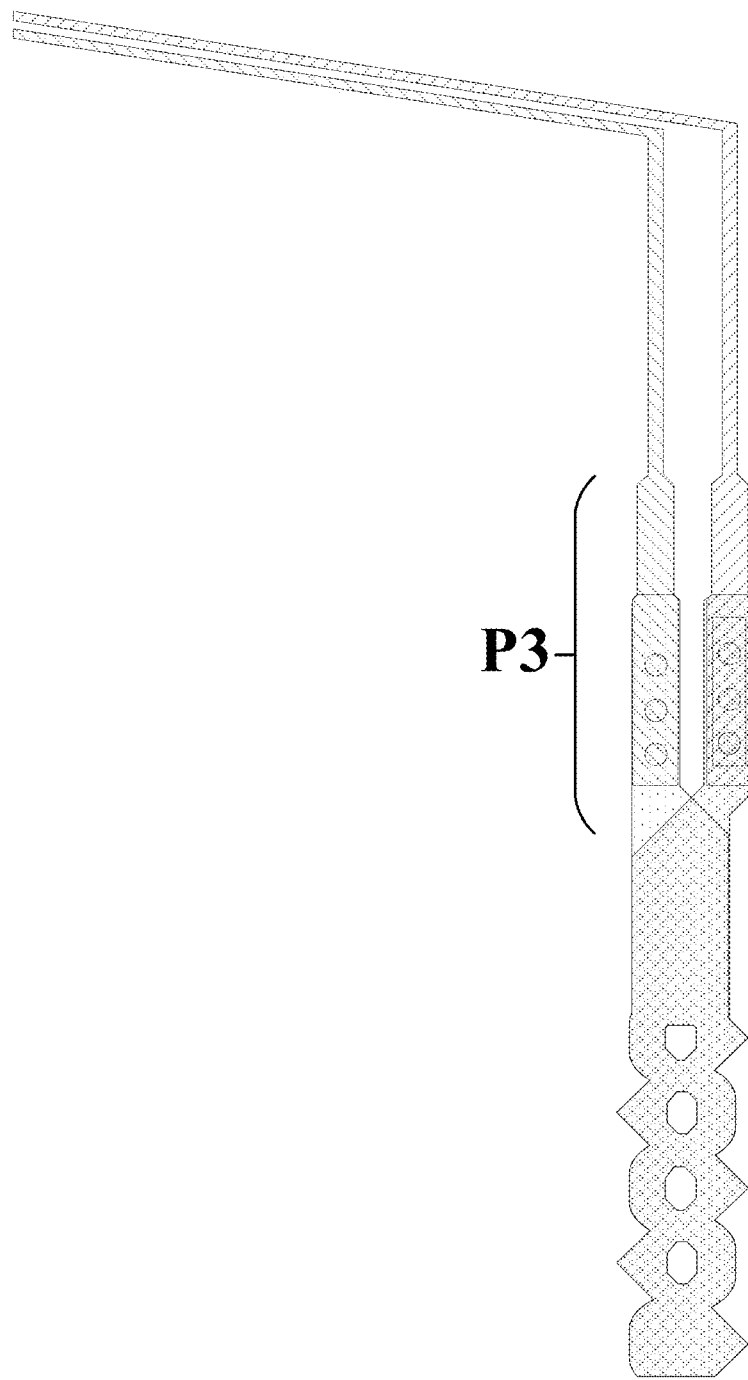
FIG. 7A illustrates the structure of a respective pair of signal lines in some embodiments according to the present disclosure.
Figure 7B:
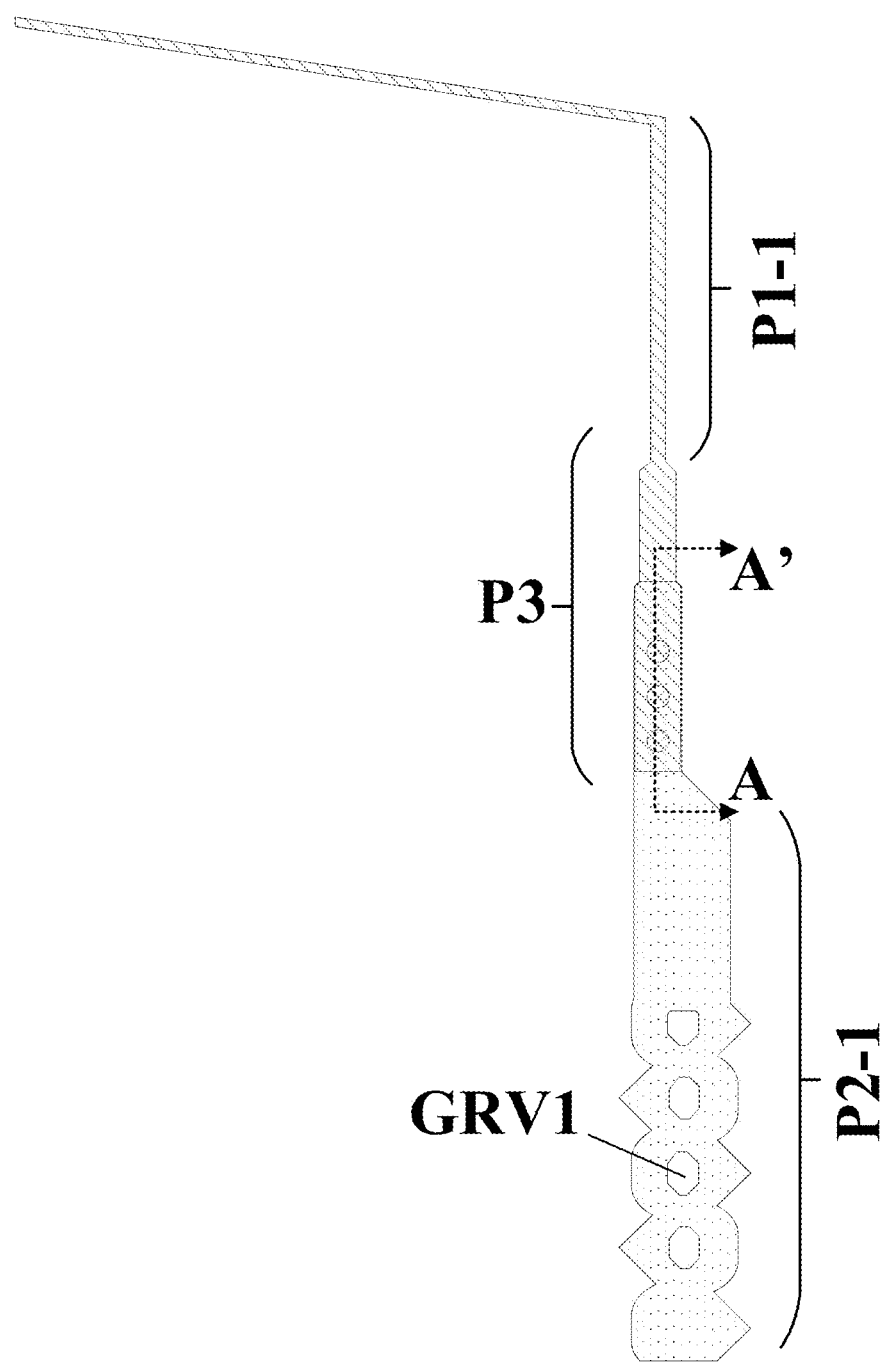
FIG. 7B illustrates the structure of a first signal line in a respective pair of signal lines in some embodiments according to the present disclosure.
Figure 7C:
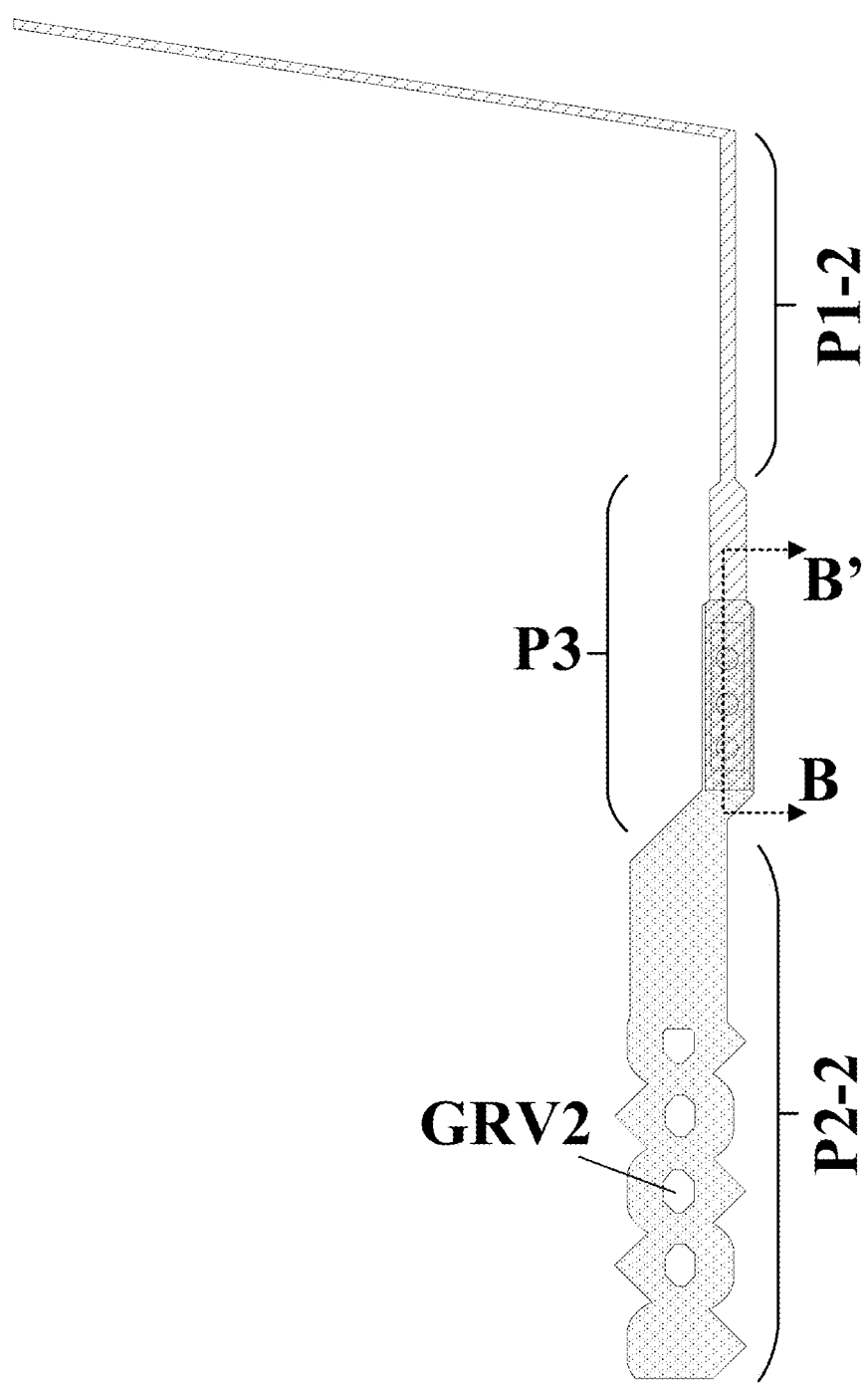
FIG. 7C illustrates the structure of a second signal line in a respective pair of signal lines in some embodiments according to the present disclosure.

In some embodiments, second portions of the plurality of signal lines are grouped into a plurality of pairs. FIG. 7A illustrates the structure of a respective pair of signal lines in some embodiments according to the present disclosure. FIG. 7B illustrates the structure of a first signal line in a respective pair of signal lines in some embodiments according to the present disclosure. FIG. 7C illustrates the structure of a second signal line in a respective pair of signal lines in some embodiments according to the present disclosure. Referring to FIG. 7A to FIG. 7C, the respective pair of signal lines in some embodiments includes a first-second portion P2-1 and a second-second portion P2-2 of two adjacent signal lines of the plurality of signal lines.

In some embodiments, orthographic projections of the first-second portion P2-1 and the second-second portion P2-2 on a base substrate at least partially overlap with each other. Referring to FIG. 7A to FIG. 7C, an orthographic projection of the first-second portion P2-1 on the base substrate overlaps with at least 30% (e.g., at least 40%, at least 50%, at least 60%, at least 70%, at least 80%, at least 90%, at least 95%, at least 99%, or 100%) of an orthographic projection of the second-second portion P2-2 on the base substrate. Similarly, the orthographic projection of the second-second portion P2-2 on the base substrate overlaps with at least 30% (e.g., at least 40%, at least 50%, at least 60%, at least 70%, at least 80%, at least 90%, at least 95%, at least 99%, or 100%) of the orthographic projection of the first-second portion P2-1 on the base substrate.

In a high-resolution array substrate, a total number of signal lines in the peripheral area is relatively high, particularly for an array substrate having a Real RGB pixel arrangement, as compared to array substrates having other pixel arrangements such as Pentile pixel arrangement. In certain regions of the array substrate, it is difficult to pattern the signal lines while maintaining a minimal pitch between adjacent signal lines. The issue becomes particularly problematic in the fanout area and the bending area where a large number of signal lines are disposed. Examples of signal lines in this area include data lines, gate lines, and touch signal lines. In one example, the signal lines are data lines connected to an integrated circuit disposed in the area (see, e.g., "IC" denoted in FIG. 3).

The inventors of the present disclosure discover that, surprisingly and unexpectedly, fabrication issues with the large number of signal lines in a limited area could be obviated with an intricate structure of the array substrate according to the present disclosure. In the fanout area, the signal lines are arranged in one or more layers. In the bending area, the signal lines are again arranged in at least two different layers. Signal lines in the bending area are in layers different from layers wherein signal lines in the fanout area are disposed. Portions of the signal lines in the bending area are at least partially stacked with respect to each other, making it possible to maintain a minimal pitch during fabrication of the signal lines.

Referring to FIG. 7A to FIG. 7C, although the first-second portion P2-1 and the second-second portion P2-2 are at least partially stacked with respect to each other, the first-second portion P2-1 and the second-second portion P2-2 are insulated from each other by an insulating layer, e.g., by a planarization layer PLN as depicted in FIG. 5A to FIG. 5G.

In some embodiments, the first-second portion P2-1 and the second-second portion P2-2 are configured to transmit different signals, e.g., different data signals, respectively. Optionally, adjacent signal lines respectively comprising the first-second portion P2-1 and the second-second portion P2-2 are configured to transmit different signals, e.g., different data signals, respectively. Optionally, the plurality of signal lines are configured to transmit different signals, e.g., different data signals, respectively.

Referring to FIG. 7A to FIG. 7C, the array substrate in some embodiments includes one or more first gas releasing vias GRV1 extending through the first-second portion P2-1, and one or more second gas releasing vias GRV2 extending through the second-second portion P2-2. As shown in FIG. 7A to FIG. 7C, in some embodiments, orthographic projections of the one or more first gas releasing vias GRV1 on a base substrate at least partially overlap with orthographic projections of the one or more second gas releasing vias GRV2 on the base substrate. Optionally, an orthographic projections of a respective first gas releasing via on the base substrate at least partially overlaps with an orthographic projection of a respective second gas releasing via on the base substrate.

In some embodiments, orthographic projections of contour lines of the first-second portion P2-1 and the second-second portion P2-2 substantially overlap with each other.

Figure 8:
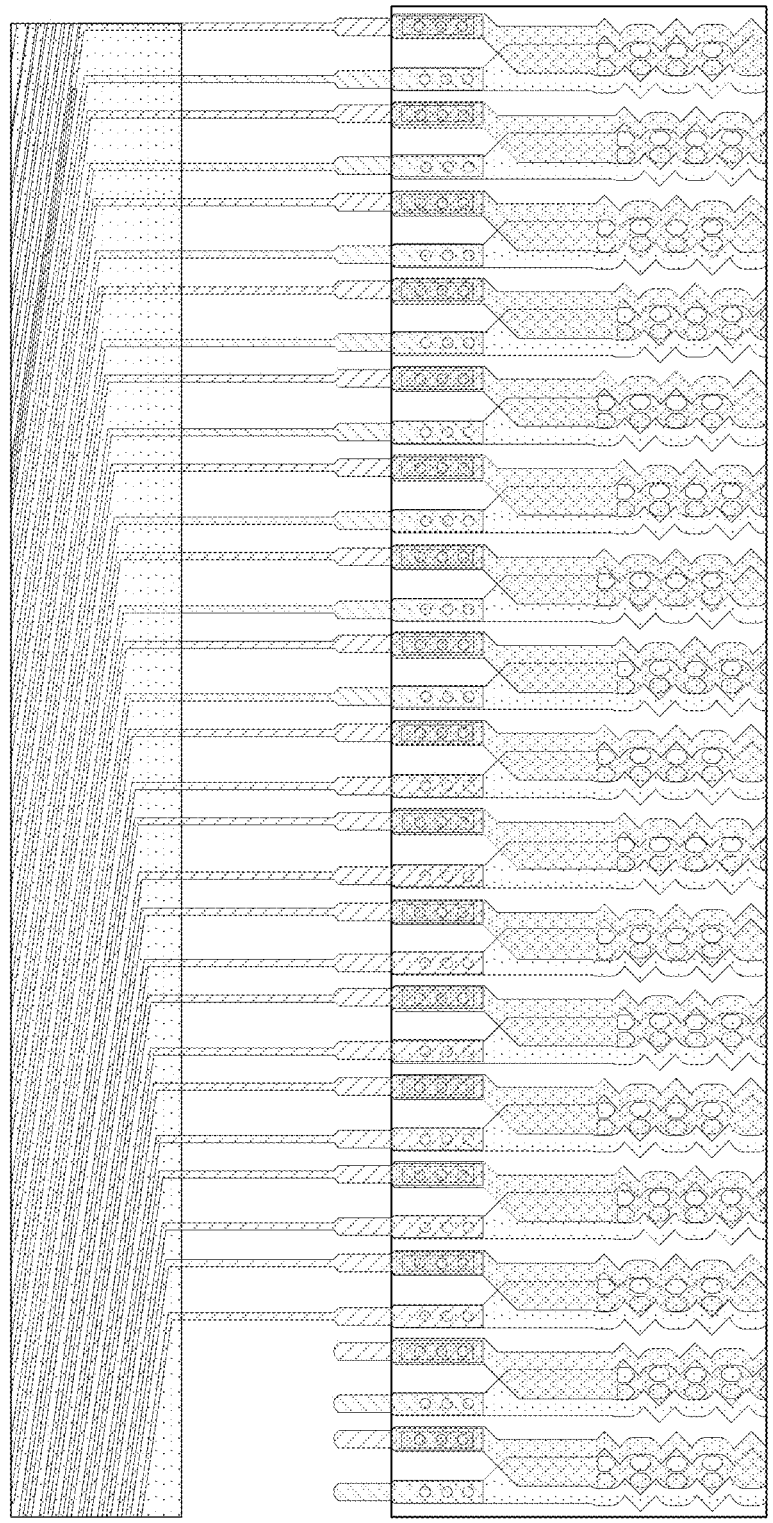
FIG. 8 illustrates the structure of a region of an array substrate in some embodiments according to the present disclosure.
Figure 9:
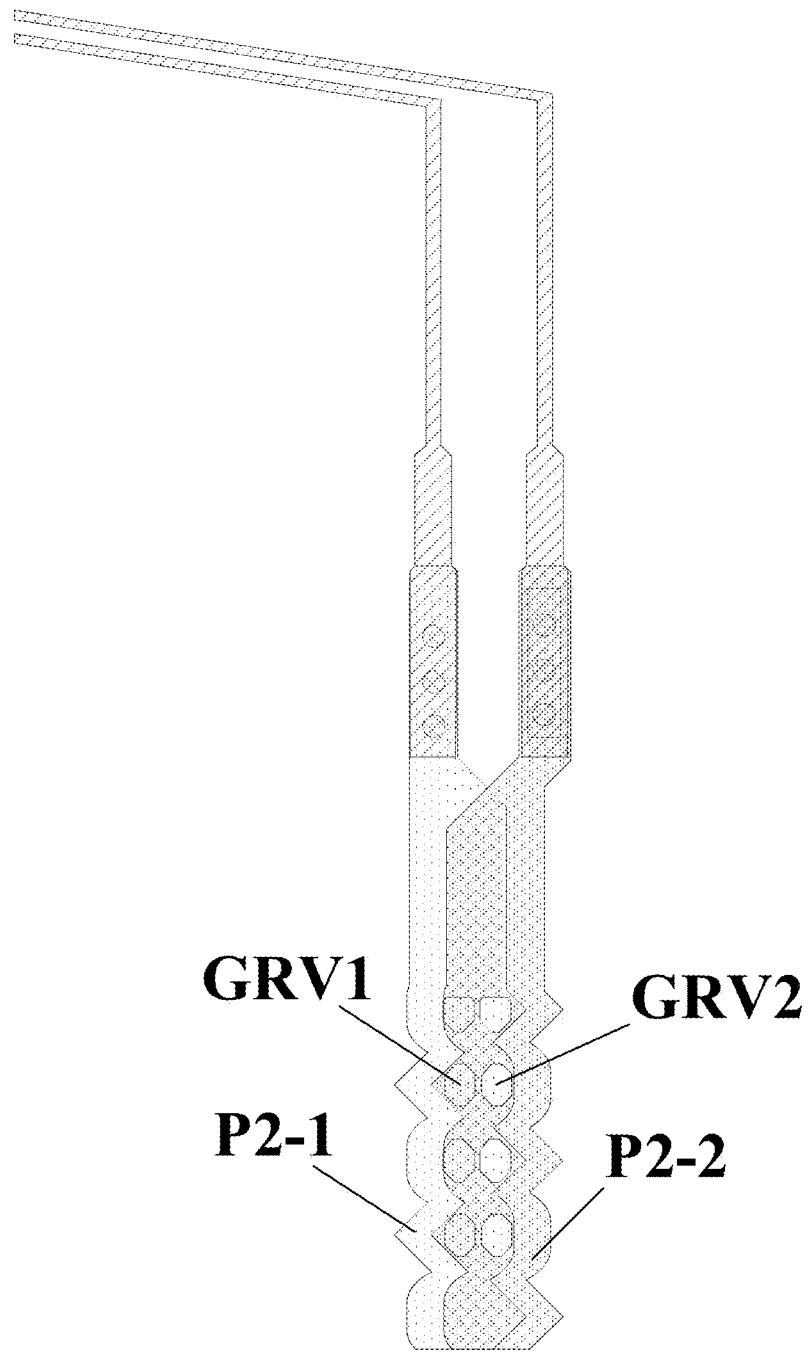
FIG. 9 illustrates the structure of a respective pair of signal lines in some embodiments according to the present disclosure.

FIG. 8 illustrates the structure of a region of an array substrate in some embodiments according to the present disclosure. FIG. 9 illustrates the structure of a respective pair of signal lines in some embodiments according to the present disclosure. Referring to FIG. 8 and FIG. 9, in some embodiments, the orthographic projections of the first-second portion P2-1 and the second-second portion P2-2 on a base substrate are at least partially non-overlapping with each other. Optionally, at least 30% (e.g., at least 40%, at least 50%, at least 60%, at least 70%, at least 80%, or at least 90%) of an orthographic projection of the first-second portion P2-1 on the base substrate is non-overlapping with an orthographic projection of the second-second portion P2-2 on the base substrate. Similarly, at least 30% (e.g., at least 40%, at least 50%, at least 60%, at least 70%, at least 80%, or at least 90%) of the orthographic projection of the second-second portion P2-2 on the base substrate is non-overlapping with the orthographic projection of the first-second portion P2-1 on the base substrate. Because the first-second portion P2-1 and the second-second portion P2-2 are configured to transmit different signals, reduction in overlapping obviates the issue of cross-talk between the first-second portion P2-1 and the second-second portion P2-2 when they are configured to transmit signals.

Referring to FIG. 8 and FIG. 9, in some embodiments, orthographic projections of the one or more first gas releasing vias GRV1 on a base substrate are at least partially non-overlapping with orthographic projections of the one or more second gas releasing vias GRV2 on the base substrate. Optionally, an orthographic projections of a respective first gas releasing via on the base substrate is at least partially non-overlapping with an orthographic projection of a respective second gas releasing via on the base substrate. Optionally, the orthographic projections of the respective first gas releasing via on the base substrate is completely non-overlapping with the orthographic projection of a respective second gas releasing via on the base substrate.

Referring to FIG. 5A to FIG. 5G, FIG. 6, FIG. 7A to FIG. 7C, FIG. 8, and FIG. 9, in some embodiments, extension directions of the first-second portion P2-1 and the second-second portion P2-2 are substantially parallel to each other, e.g., substantially parallel to a first direction DR1 as depicted in FIG. 5A. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

Referring to FIG. 5A and FIG. 8, in some embodiments, a ratio between a total number of second portions and a total number of first portions is 1:1.

Figure 10:
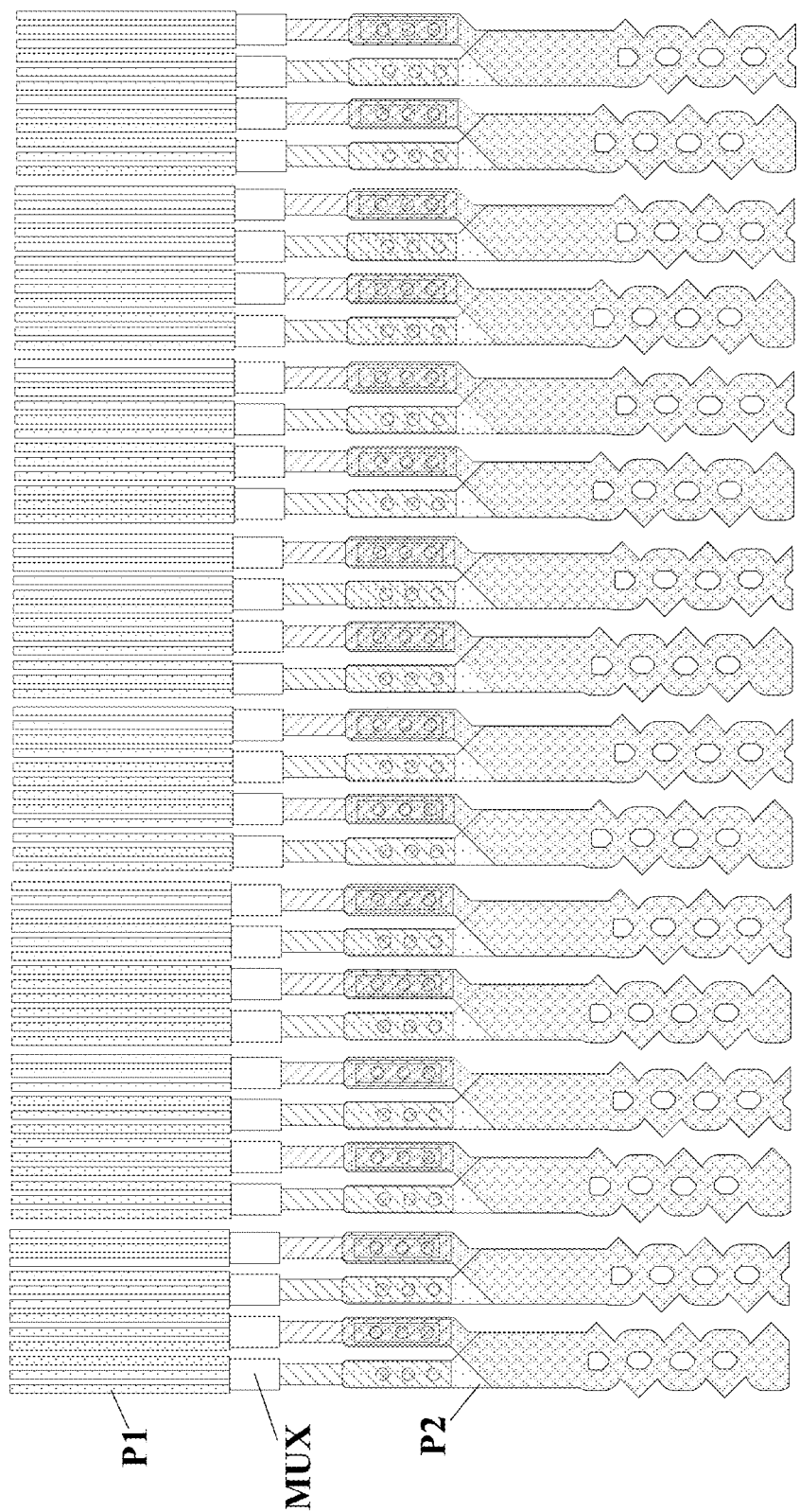
FIG. 10 illustrates the structure of a region of an array substrate in some embodiments according to the present disclosure.

FIG. 10 illustrates the structure of a region of an array substrate in some embodiments according to the present disclosure. Referring to FIG. 10, the array substrate in some embodiments further includes one or more multiplexers MUX. A respective multiplexer is electrically connected to a respective second portion (an individual one is denoted as "P2" in FIG. 10), and is electrically connected to multiple first portions (an individual one is denoted as "P1" in FIG. 10). By having multiplexers, the number of second portions may be further reduced, allowing additional space for disposing the second portions. The structure is conducive to maintain a minimal pitch during fabrication of the signal lines.

Referring to FIG. 5A, FIG. 8, and FIG. 10, the stacked structure of second portions includes two layers of second portions. In one example, the first layers of second portions are in a first signal line layer (corresponding to the SLL1 layer in FIG. 4A and FIG. 4B), and the second layer of second portions are in a second signal line layer (corresponding to the SLL2 layer in FIG. 4B).

In some embodiments, the stacked structure of second portions includes more than two (e.g., 3, 4, or more) layers of second portions. By having a stacked structure of second portions having more than two layers of second portions, the number of second portions may be further reduced, allowing additional space for disposing the second portions.

Referring to FIG. 5A to FIG. 5C, in some embodiments, at least two first portions of the plurality of signal lines are in two different layers, e.g., a first metal layer and a second metal layer. Optionally, the first portions of the plurality of signal lines may be disposed in more than two layers. In one specific example, first portions of the plurality of signal lines SL are alternately in a first metal layer and a second metal layer along a second direction DR2, as shown in FIG. 5A to FIG. 5C. In one example, the second direction DR2 is perpendicular to extension directions of the first portions of the plurality of signal lines SL.

Referring to FIG. 5A and FIG. 6, the respective signal line of the plurality of signal lines SL in some embodiments further includes a third portion P3 between the first portion P1 and the second portion P2. Optionally, the third portion P3 is in a third area A3 between the first area A1 and the second area A2. Optionally, the third portion P3 connects the first portion P1 and the second portion P2 together. Optionally, extension directions of the first portion P1, the second portion P2, and the third portion P3 are substantially parallel to each other, e.g., substantially parallel to a first direction DR1 as depicted in FIG. 5A.

In some embodiments, the third portion P3 includes a first sub-layer SUB1 connected to, in a same layer as, the first portion P1, and a second sub-layer SUB2 connected to, in a same layer as, the second portion P2. In some embodiments, at least two first sub-layers of third portions of the plurality of signal lines are in two different layers, e.g., a first metal layer and a second metal layer. Optionally, the first sub-layers of the third portions of the plurality of signal lines SL are alternately in a first metal layer and a second metal layer, along a second direction DR2, as shown in FIG. 5A to FIG. 5C. In one example, the second direction DR2 is perpendicular to extension directions of the first sub-layers of the third portions of the plurality of signal lines SL.

In some embodiments, the first sub-layer SUB1 and the first portion P1 of a respective signal line of the plurality of signal lines SL are parts of a first unitary structure. Optionally, at least two first unitary structures of the first portions and first sub-layers are in two different layers, e.g., a first metal layer and a second metal layer. Optionally, first unitary structures of the first portions and first sub-layers are alternately in a first metal layer and a second metal layer, along a second direction DR2, as shown in FIG. 5A to FIG. 5C. In one example, the second direction DR2 is perpendicular to extension directions of the first unitary structures.

In some embodiments, at least two second sub-layers of third portions of the plurality of signal lines are in two different layers, e.g., a first signal line layer and a second signal line layer. Optionally, the second sub-layers of the third portions of the plurality of signal lines SL are alternately in a first signal line layer and a second signal line layer, along a second direction DR2, as shown in FIG. 5A to FIG. 5C. In one example, the second direction DR2 is perpendicular to extension directions of the second sub-layers of the third portions of the plurality of signal lines SL.

In some embodiments, the second sub-layer SUB2 and the second portion P2 of a respective signal line of the plurality of signal lines SL are parts of a second unitary structure. Optionally, at least two second unitary structures of the second portions and second sub-layers are in two different layers, e.g., a first signal line layer and a second signal line layer. Optionally, second unitary structures of the second portions and second sub-layers are alternately in a first signal line layer and a second signal line layer, along a second direction DR2, as shown in FIG. 5A to FIG. 5C. In one example, the second direction DR2 is perpendicular to extension directions of the second unitary structures.

In some embodiments, orthographic projections of adjacent third portions on the base substrate are at least partially non-overlapping. Optionally, orthographic projections of the first sub-layer SUB1 and the second sub-layer SUB2 in a respective signal line on the base substrate are at least partially overlapping.

Figure 11A:
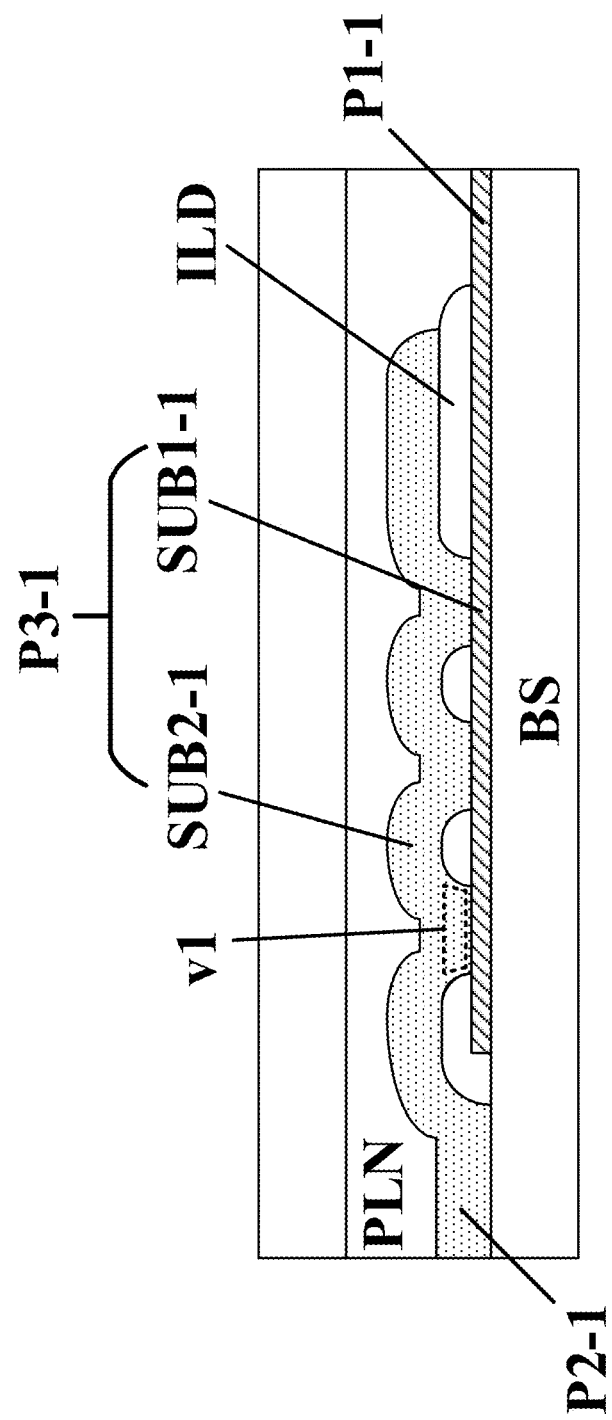
FIG. 11A is a cross-sectional view along an A-A' line in FIG. 7B in some embodiments according to the present disclosure.
Figure 11B:
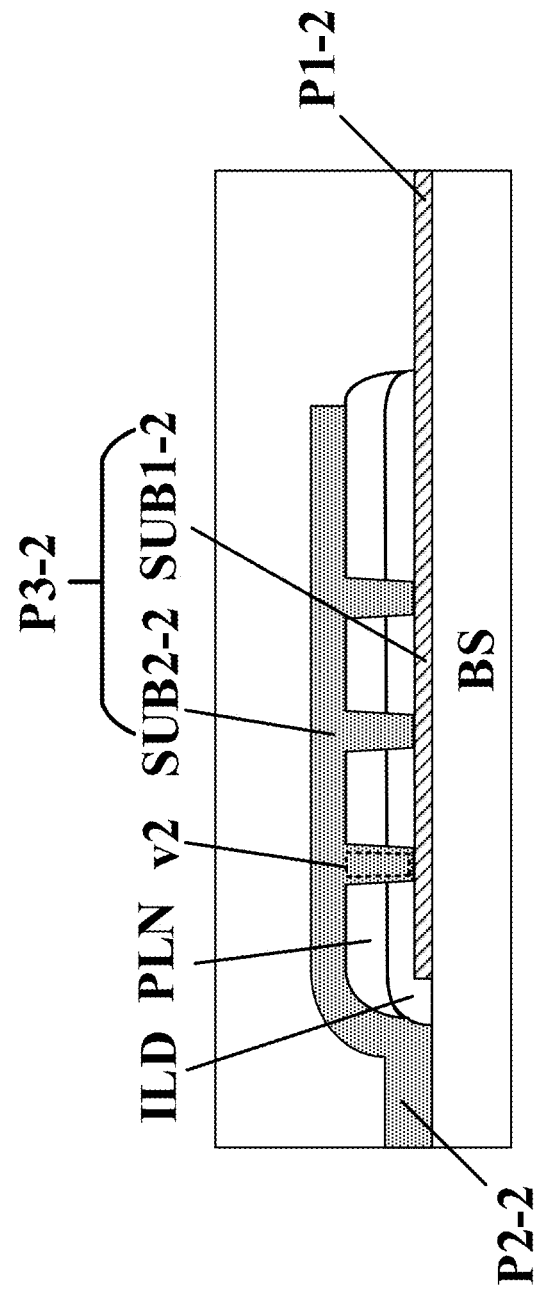
FIG. 11B is a cross-sectional view along a B-B' line in FIG. 7C in some embodiments according to the present disclosure.

In some embodiments, the first sub-layer SUB1 is connected to the second sub-layer SUB2 through a via extending through an insulating layer. FIG. 11A is a cross-sectional view along an A-A' line in FIG. 7B in some embodiments according to the present disclosure. FIG. 11B is a cross-sectional view along a B-B' line in FIG. 7C in some embodiments according to the present disclosure. FIG. 11A and FIG. 11B illustrate a respective pair of two adjacent third portions respectively from two adjacent signal lines of the plurality of signal lines. Referring to FIG. 11A and FIG. 11B, the two adjacent signal lines include two adjacent first portions, respectively, including a first-first portion P1-1 and a second-first portion P1-2. The two adjacent signal lines further include two adjacent second portions, respectively, including a first-second portion P2-1 and a second-second portion P2-2. The two adjacent signal lines further include two adjacent third portions, respectively. Referring to FIG. 5A to FIG. 5G, FIG. 7A to FIG. 7C, and FIG. 11A to FIG. 11B, in some embodiments, a first-third portion P3-1 includes a first-first sub-layer SUB1-1 and a first-second sub-layer SUB2-1. The first-second sub-layer SUB2-1 is connected to the first-first sub-layer SUB1-1 through one or more first vias v1 extending through the inter-layer dielectric layer ILD. A second-third portion P3-2 includes a second-first sub-layer SUB1-2 and a second-second sub-layer SUB2-2. The second-second sub-layer SUB2-2 is connected to the second-first sub-layer SUB1-2 through one or more second vias v2 extending through the inter-layer dielectric layer ILD and the planarization layer PLN.

Figure 11C:
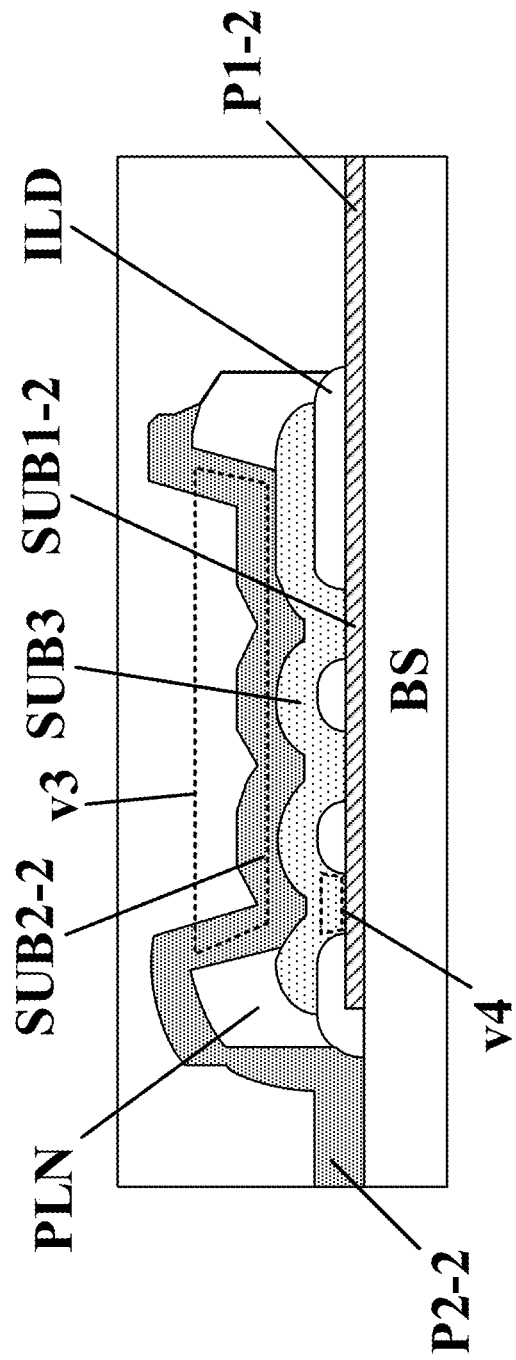
FIG. 11C is a cross-sectional view along a B-B' line in FIG. 7C in some embodiments according to the present disclosure.

FIG. 11C is a cross-sectional view along a B-B' line in FIG. 7C in some embodiments according to the present disclosure. Referring to FIG. 5A to FIG. 5G, FIG. 7A to FIG. 7C, FIG. 11A, and FIG. 11C, in some embodiments, the second-third portion P3-2 further includes a third sub-layer SUB3 between the second-first sub-layer SUB1-2 and the second-second sub-layer SUB2-2. The second-second sub-layer SUB2-2 is connected to the third sub-layer SUB3 through a third via v3 extending through the planarization layer PLN. The third sub-layer SUB3 is connected to the second-first sub-layer SUB1-2 through one or more fourth via v4 extending through the inter-layer dielectric layer ILD.

In some embodiments, the second-second sub-layer SUB2-2 is in the second signal line layer, the third sub-layer SUB3 is in the first signal line layer, and the second-first sub-layer SUB1-2 is in a layer selected from the first metal layer and the second metal layer.

Referring to FIG. 11A to FIG. 11C, in some embodiments, the second-first sub-layer SUB1-2 and the second-first portion P1-2 are in a same layer. The second-first sub-layer SUB1-2 is connected to the second-first portion P1-2. Optionally, the second-first sub-layer SUB1-2 and the second-first portion P1-2 are parts of a unitary structure.

Referring to FIG. 11A to FIG. 11C, in some embodiments, the second-second sub-layer SUB2-2 and the second-second portion P2-2 are in a same layer. The second-second sub-layer SUB2-2 is connected to the second-second portion P2-2. Optionally, the second-second sub-layer SUB2-2 and the second-second portion P2-2 are parts of a unitary structure.

In some embodiments, referring to FIG. 5A, FIG. 11A to FIG. 11C, the array substrate includes a plurality of junction structure JS. In some embodiments, a respective junction structure includes a first-second portion P2-1; a second-second portion P2-2; a first-first sub-layer SUB1-1 of a first-third portion P3-1; a first-second sub-layer SUB2-1 of the first-third portion P3-1 connected to, in a same layer as, the first-second portion P2-1; a second-first sub-layer SUB1-2 of a second-third portion P3-2; and a second-second sub-layer SUB2-2 of the second-third portion P3-2 connected to, in a same layer as, the second-second portion P2-2. Optionally, the first-first sub-layer SUB1-1 is connected to, in a same layer as, a first-first portion P1-1. Optionally, the second-first sub-layer SUB1-2 is connected to, in a same layer as, a second-first portion P1-2. Optionally, the first-first portion P1-1 and the second-first portion P1-2 are two adjacent first portions of the two adjacent signal lines.

In some embodiments, in the respective junction structure, the first-first sub-layer SUB1-1, the first-second sub-layer SUB2-1, the second-first sub-layer SUB1-2, and the second-second sub-layer SUB2-2 are in four different layers, respectively. Optionally, the first-first sub-layer SUB1-1 and the second-first sub-layer SUB1-2 are in two different layers selected from a first metal layer and a second metal layer. In one example, the first-first sub-layer SUB1-1 is in the first metal layer and the second-first sub-layer SUB1-2 is in the second metal layer. In another example, the first-first sub-layer SUB1-1 is in the second metal layer and the second-first sub-layer SUB1-2 is in the first metal layer. Optionally, the first-second sub-layer SUB2-1 and the second-second sub-layer SUB2-2 are in two different layers selected from a first signal line layer and a second signal line layer. In one example, the first-second sub-layer SUB2-1 is in the first signal line layer, and the second-second sub-layer SUB2-2 is in the second signal line layer. In another example, the first-second sub-layer SUB2-1 is in the second signal line layer, and the second-second sub-layer SUB2-2 is in the first signal line layer.

Referring to FIG. 5A to FIG. 5G, and FIG. 6, in some embodiments, the respective signal line of the plurality of signal lines further includes a fourth portion P4 in a fourth area A4. The fourth portion P4 is on a side of the first portion P1 away from the second portion P2. The fourth portion P4 is connected to, in a same layer as, the first portion P1. Optionally, extension directions of the fourth portion P4 and the first portion P1 are different. As shown in FIG. 5A, in one example, the extension direction of the fourth portion P4 is substantially parallel to a third direction DR3, while the extension direction of the first portion P1 is substantially parallel to a first direction DR1. The first direction DR1 and the third direction DR3 are non-parallel to each other.

In some embodiments, at least two fourth portions of the plurality of signal lines are in two different layers, e.g., a first metal layer and a second metal layer. Optionally, the fourth portions of the plurality of signal lines may be disposed in more than two layers. In one specific example, fourth portions of the plurality of signal lines SL are alternately in a first metal layer and a second metal layer along a fourth direction DR4, as shown in FIG. 5A to FIG. 5C. In one example, the fourth direction DR4 is perpendicular to extension directions (e.g., the third direction DR3) of the fourth portions of the plurality of signal lines SL.

Optionally, the first metal layer is in a same layer as the first gate metal layer Gate1 as depicted in FIG. 4A or FIG. 4B, and the second metal layer is in a same layer as the second gate metal layer Gate2 as depicted in FIG. 4A or FIG. 4B.

Optionally, the first metal layer is in a same layer as the second gate metal layer Gate2 as depicted in FIG. 4A or FIG. 4B, and the second metal layer is in a same layer as the first gate metal layer Gate1 as depicted in FIG. 4A or FIG. 4B.

In some embodiments, orthographic projections of two adjacent fourth portions are partially overlapping with each other. Portions of the fourth portions in the fourth area A4 are at least partially stacked with respect to each other, making it possible to maintain a minimal pitch during fabrication of the fourth portions.

Referring to FIG. 5A to FIG. 5G, the array substrate in some embodiments further includes a peripheral voltage supply line PVSS, for example, configured to provide a voltage signal (e.g., a low voltage signal to cathodes of light emitting elements) to the array substrate. Optionally, an orthographic projection of the peripheral voltage supply line PVSS on the base substrate at least partially overlaps with orthographic projections of fourth portions on the base substrate. Optionally, the orthographic projection of the peripheral voltage supply line PVSS on the base substrate at least partially overlaps with orthographic projections of first portions on the base substrate.

In another aspect, the present disclosure provides a display apparatus. In some embodiments, the display apparatus includes an array substrate described herein, and an integrated circuit connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present disclosure provides a method of fabricating an array substrate. In some embodiments, the method includes forming a plurality of signal lines. Optionally, forming a respective signal line of the plurality of signal lines includes forming a first portion in a first area and forming a second portion in a second area, the first portion and the second portion being formed in different layers. Optionally, second portions of the plurality of signal lines are grouped into a plurality of pairs, a respective pair formed to include a first-second portion and a second-second portion of two adjacent signal lines of the plurality of signal lines. Optionally, orthographic projections of the first-second portion and the second-second portion on a base substrate at least partially overlap with each other.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a display area, a bending area, and a fanout area between the display area and the bending area, and a plurality of signal lines;
   wherein a respective signal line of the plurality of signal lines comprises a first portion in a first area and a second portion in a second area, the first portion and the second portion being in different layers;
   the first area is at least partially in the fanout area;
   the second area is at least partially in the bending area;

orthographic projections of first portions in the fanout area of adjacent signal lines of the plurality of signal lines on a base substrate are non-overlapping with each other;

second portions of the plurality of signal lines are grouped into a plurality of pairs, a respective pair comprising a first-second portion and a second-second portion of two adjacent signal lines of the plurality of signal lines;

the first-second portion and a second-second portion in the bending area are in different layers; and orthographic projections of the first-second portion and the second-second portion on the base substrate at least partially overlap with each other.

2. The array substrate of claim 1, wherein at least two first portions of the plurality of signal lines are in two different layers.

3. The array substrate of claim 2, wherein first portions of the plurality of signal lines are alternately in a first metal layer and a second metal layer.

4. The array substrate of claim 1, wherein the respective signal line of the plurality of signal lines further comprises a third portion between the first portion and the second portion, and in a third area; and the third portion comprises a first sub-layer connected to, in a same layer as, the first portion, and a second sub-layer connected to, in a same layer as, the second portion.

5. The array substrate of claim 4, wherein the second sub-layer is connected to the first sub-layer through a via extending through an insulating layer.

6. The array substrate of claim 4, wherein orthographic projections of adjacent third portions on the base substrate are at least partially non-overlapping.

7. The array substrate of claim 4, wherein second sub-layers of third portions of the plurality of signal lines are alternately in a first signal line layer and a second signal line layer.

8. The array substrate of claim 4, wherein at least two first sub-layers of third portions of the plurality of signal lines are in two different layers.

9. The array substrate of claim 8, wherein first sub-layers of third portions of the plurality of signal lines are alternately in a first metal layer and a second metal layer.

10. The array substrate of claim 1, comprising a plurality of junction structures;

wherein a respective junction structure comprises:
the first-second portion;
the second-second portion;
a first-first sub-layer of a first-third portion;
a first-second sub-layer of the first-third portion connected to, in a same layer as, the first-second portion;
a second-first sub-layer of a second-third portion; and
a second-second sub-layer of the second-third portion connected to, in a same layer as, the second-second portion.

11. The array substrate of claim 10, wherein the first-first sub-layer, the first-second sub-layer, the second-first sub-layer, and the second-second sub-layer are in four different layers, respectively.

12. The array substrate of claim 11, wherein the first-first sub-layer and the second-first sub-layer are in two different layers selected from a first metal layer and a second metal layer; and the first-second sub-layer and the second-second sub-layer are in two different layers selected from a first signal line layer and a second signal line layer.

13. The array substrate of claim 10, wherein the first-first sub-layer is connected to, in a same layer as, a first-first portion;

the second-first sub-layer is connected to, in a same layer as, a second-first portion; and the first-first portion and the second-first portion are two adjacent first portions of the two adjacent signal lines.

14. The array substrate of claim 1, wherein the respective signal line of the plurality of signal lines further comprises a fourth portion in a fourth area;

the fourth portion is electrically connected to a signal line in a display area;

the fourth portion is connected to, in a same layer as, the first portion; and extension directions of the fourth portion and the first portion are different.

15. The array substrate of claim 14, wherein at least two fourth portions of the plurality of signal lines are in two different layers.

16. The array substrate of claim 15, wherein fourth portions of the plurality of signal lines are alternately in a first metal layer and a second metal layer.

17. The array substrate of claim 14, wherein orthographic projections of two adjacent fourth portions are partially overlapping with each other.

18. The array substrate of claim 14, wherein extension direction of the first portion and the second portion are substantially the same.

19. A display apparatus, comprising the array substrate of claim 1, and an integrated circuit connected to the array substrate.

* * * * *